(12) United States Patent
Yang et al.

(10) Patent No.: US 10,218,789 B2
(45) Date of Patent: Feb. 26, 2019

(54) ERASURE CORRECTING CODING USING TEMPORARY ERASURE DATA

(71) Applicant: WESTERN DIGITAL TECHNOLOGIES, INC., San Jose, CA (US)

(72) Inventors: Nian Niles Yang, Mountain View, CA (US); Steven T. Sprouse, San Jose, CA (US); Philip David Reusswig, Mountain View, CA (US); Tienchien Kuo, Sunnyvale, CA (US); Xinmiao Zhang, Mercer Island, WA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/782,618

(22) Filed: Oct. 12, 2017

(65) Prior Publication Data
US 2018/0032395 A1 Feb. 1, 2018

Related U.S. Application Data

(63) Continuation-in-part of application No. 15/179,325, filed on Jun. 10, 2016.
(Continued)

(51) Int. Cl.
*H04L 29/08* (2006.01)
*G06F 11/10* (2006.01)
(Continued)

(52) U.S. Cl.
CPC ...... *H04L 67/1097* (2013.01); *G06F 11/1012* (2013.01); *G06F 11/1068* (2013.01);
(Continued)

(58) Field of Classification Search
CPC .. G06F 11/14; G06F 11/1068; G06F 11/1072; G06F 11/1092; G06F 11/112028;
(Continued)

(56) References Cited

U.S. PATENT DOCUMENTS 5,377,207 A 12/1994 Perlman
8,156,405 B1 4/2012 Lumb et al.
(Continued)

OTHER PUBLICATIONS

Zhu et al., On the Speedup of Recovery in Large Scale Erasure-Coded Storage Systems, IEEE, Trans. on Parallel & Distributed Sys., vol. 25, No. 7, pp. 1830-1840 (Year: 2014).*
(Continued)

*Primary Examiner* — Shelly A Chase
(74) *Attorney, Agent, or Firm* — Michael Best & Friedrich LLP

(57) ABSTRACT

In an illustrative example, a data storage device includes a non-volatile memory and a controller coupled to the non-volatile memory. The controller includes an erasure correcting code engine configured to generate first erasure recovery data and temporary erasure recovery data in a volatile memory at least partially based on first data to be written to the non-volatile memory. The first erasure recovery data is configured to enable a first type of data recovery of the first data, and the temporary erasure recovery data is configured to enable a second type of data recovery of the first data. The controller is further configured to store the first erasure recovery data and the temporary erasure recovery data in the volatile memory and, after verifying that the first data is stored in the non-volatile memory, to discard or modify the temporary erasure recovery data.

20 Claims, 11 Drawing Sheets

Related U.S. Application Data

(60) Provisional application No. 62/304,113, filed on Mar. 4, 2016.

(51) Int. Cl.
*H03M 13/15* (2006.01)
*G11C 29/52* (2006.01)
*H03M 13/03* (2006.01)
*H03M 13/13* (2006.01)
*H03M 13/35* (2006.01)
*H03M 13/37* (2006.01)

(52) U.S. Cl.
CPC ............ *G11C 29/52* (2013.01); *H03M 13/033* (2013.01); *H03M 13/13* (2013.01); *H03M 13/154* (2013.01); *H03M 13/1515* (2013.01); *H03M 13/356* (2013.01); *H03M 13/373* (2013.01); *H03M 13/3761* (2013.01)

(58) Field of Classification Search
CPC ............ G06F 11/2089; G06F 11/1048; G06F 11/108; G06F 11/1012; H03M 13/15; H03M 13/154; H03M 13/1515; H03M 13/373; H03M 13/356; H03M 13/3761; H04L 67/10; H04L 67/1097; H04L 69/40; G11C 29/42; G11C 29/52; G11C 16/345; G11C 16/3445; G11C 16/3459

See application file for complete search history.

(56) References Cited

U.S. PATENT DOCUMENTS

| | | | |
|---|---|---|---|
| 8,437,183 | B2 | 5/2013 | Sharon et al. |
| 8,707,093 | B1 | 4/2014 | Sites |
| 8,856,593 | B2* | 10/2014 | Eckhardt ............ G06F 11/2028 709/217 |
| 8,914,706 | B2 | 12/2014 | Anderson |
| 8,918,701 | B2 | 12/2014 | Blaum et al. |
| 9,009,565 | B1 | 4/2015 | Northcott et al. |
| 2009/0077449 | A1 | 3/2009 | Lee |
| 2010/0174968 | A1 | 7/2010 | Charles et al. |
| 2013/0031429 | A1 | 1/2013 | Sharon et al. |
| 2016/0211869 | A1* | 7/2016 | Blaum ................ H03M 13/373 |

OTHER PUBLICATIONS

Tamo et al., "A family of optimal locally recoverable codes," IEEE Trans. on Info. Theory, vol. 60, No. 8, Aug. 2014, 16 pages.
Rashmi et al., "A piggybacking design framework for read-and-download-efficient distributed storage codes," Proc. IEEE Intl. Symp. Info. Theory, 2013, 19 pages.
Pamies-Juarez et al., "Locally repairable codes with multiple repair alternatives," Proc. IEEE Intl. Symp. Info. Theory, 2013, 5 pages.
Zeh et al., "Optimal linear and cyclic locally repairable codes over small fields," IEEE Info. Theory Workshop, 2015, 5 pages.
MacWilliams et al., The Theory of Error-Correcting Codes, North Holland Publishing Co., Amsterdam, The Netherlands, vol. 16, 1977, 771 pages.

* cited by examiner

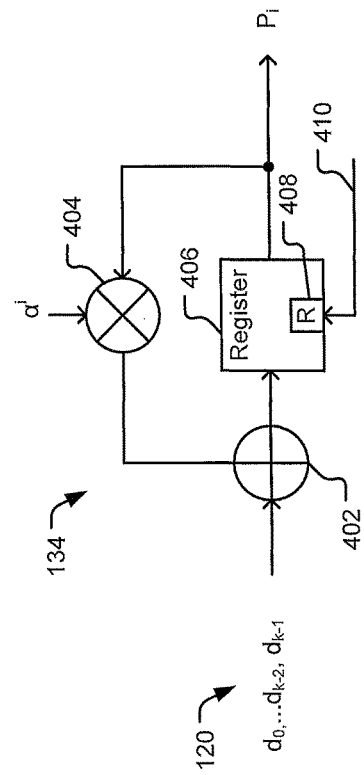

US 10,218,789 B2

ERASURE CORRECTING CODING USING TEMPORARY ERASURE DATA

CROSS-REFERENCE TO RELATED APPLICATIONS

The present application claims priority from and is a continuation-in-part of U.S. patent application Ser. No. 15/179,325, filed Jun. 10, 2016, which claims benefit of U.S. Provisional Application No. 62/304,113, filed Mar. 4, 2016. The contents of each of these applications are incorporated by reference herein in their entirety.

FIELD OF THE DISCLOSURE

The present disclosure is generally related to electronic devices and more particularly to erasure correcting coding using data subsets for an electronic device.

BRIEF DESCRIPTION OF THE DRAWINGS

FIG. 3 is a diagram illustrating particular aspects of an example of a parity check matrix corresponding to an erasure correcting code and parity splitting schemes associated with the erasure correcting code.

FIG. 4 is another diagram illustrating particular aspects of an example of an encoder configured to encode subsets of data associated with an erasure correcting code.

DETAILED DESCRIPTION

Particular aspects of the disclosure are described below with reference to the drawings. In the description, common or similar features may be designated by common reference numbers. As used herein, "exemplary" may indicate an example, an implementation, and/or an aspect, and should not be construed as limiting or as indicating a preference or a preferred implementation. Although certain examples are described herein with reference to a data storage device, it should be appreciated that techniques described herein are applicable to other implementations. For example, information can be received by a communication device (e.g., wirelessly or from a wired network) alternatively or in addition to accessing information from a memory. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

Figure 1:
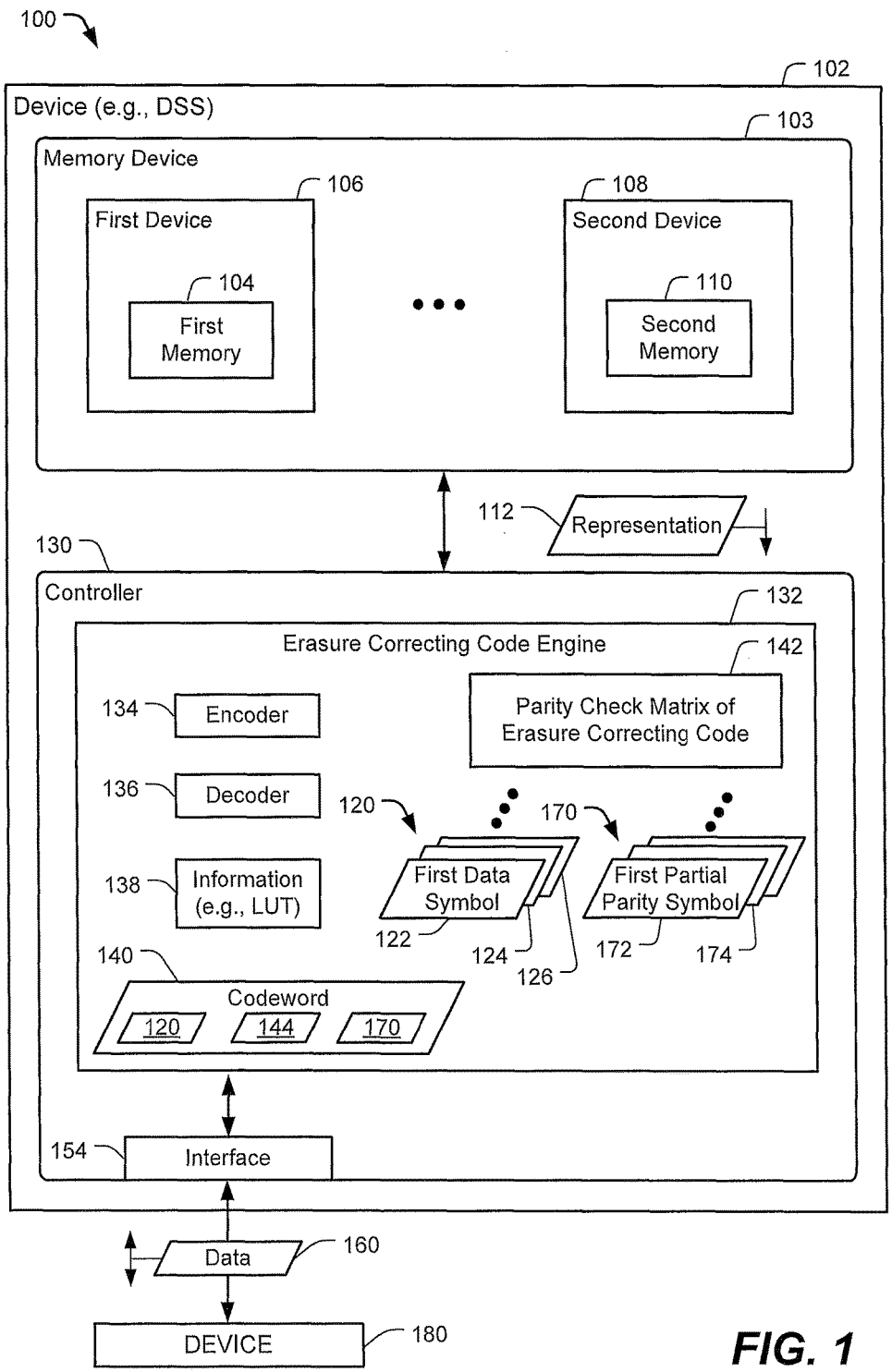
FIG. 1 is a diagram of a particular example of a system including an erasure correcting code engine that is configured to perform erasure correcting coding using data subsets.

Referring to FIG. 1, a particular illustrative example of system is depicted and generally designated 100. The system 100 includes a device 102 (e.g., a distributed storage system (DSS) or a data storage device) and a device 180 (e.g., an access device that accesses the device 102). The device 102 includes a memory device 103 (e.g., an array of drives) and a controller 130 coupled to the memory device 103. The device 180 may be coupled to the DSS via a wired connection (e.g., a bus or a wired network), a wireless connection, a local area connection (LAN), a wide area connection (WAN), the Internet, or a combination thereof.

The memory device 103 includes multiple devices, such as a first device 106 and a second device 108. An example of a device of the memory device 103 is a memory die. Another example of a device of the memory device 103 is a memory drive, such as a flash memory drive, a resistive memory drive (e.g., a resistive random access memory (ReRAM) drive), a hard disk drive (HDD), or a hybrid HDD. The first device 106 may include a first memory 104 (e.g., a flash memory, a resistive memory, an HDD, or a hybrid HDD, as illustrative examples), and the second device 108 may include a second memory 110 (e.g., a flash memory, a resistive memory, an HDD, or a hybrid HDD, as illustrative examples).

The controller 130 may include an erasure correcting code engine 132 and an interface 154 (e.g., a host interface or an access device interface). The interface 154 is configured to receive data 160 from the device 180 in connection with a request for write access to the memory device 103. The interface 154 is configured to provide the data 160 to the device 180 in connection with a request for read access to the memory device 103. The controller 130 may store information 138, such as a lookup table (LUT).

The erasure correcting code engine 132 may include an encoder 134 and a decoder 136. The erasure correcting code engine 132 is configured to operate based on an erasure correcting code. For example, the encoder 134 is configured to encode the data 160 based on as erasure correcting code associated with a parity check matrix 142. As another example, the decoder 136 is configured to decode data in accordance with parity check equations specified by the parity check matrix 142.

During operation, the controller 130 may receive the data 160 from the device 180. The data 160 may include a set of data symbols 120. In an another example, the controller 130 may generate the set of data symbols 120 based on the data 160, such as by encoding the data 160 based on an error correcting code (ECC), scrambling the data 160, performing one or more other operations, or a combination thereof.

The controller 130 may encode the set of data symbols 120 in accordance with an erasure correcting code. For example, the controller 130 may input the data 160 to the erasure correcting code engine 132 to be encoded by the encoder 134 to generate a codeword 140 of an erasure correcting code associated with the parity check matrix 142. The codeword 140 may include the set of data symbols 120, parity symbols 144 generated based on the set of data symbols 120 in accordance with the erasure correcting code, and a set of "partial" parity symbols 170.

The encoder 134 is configured to generate the set of partial parity symbols 170 based on subsets of the set of data symbols 120 using the erasure correcting code. As used herein, a "subset" refers to a proper subset of a set of elements (i.e., fewer than all elements of the set). The set of partial parity symbols 170 includes a first partial parity symbol 172 (e.g., a first partial parity symbol) that is generated based on a first subset of the set of data symbols 120. For example, the first partial parity symbol 172 may be generated based on a first data symbol 122 of the set of data symbols 120 and further based on a second data symbol 124 of the set of data symbols 120 (e.g., independently of a third data symbol 126 of the set of data symbols 120). The first partial parity symbol 172 enables recovery of a data symbol of the first subset independently of a second subset of the set of data symbols. For example, the first partial parity symbol 172 may enable recovery of the first data symbol 122 after an erasure event associated with the first data symbol 122. As another example, the first partial parity symbol 172 may enable recovery of the second data symbol 124 after an erasure event associated with the second data symbol 124. The second partial parity symbol 174 may be generated based on a different subset of the set of data symbols than the first partial parity symbol 172.

The controller 130 may send the codeword 140 to the memory device 103 to be stored at one or more devices of the memory device 103. For example, the controller 130 may send a write command to cause the memory device 103 to store the codeword 140 to the first device 106, to the second device 108, or a combination thereof. For example, one or more data symbols of the set of data symbols 120 may be stored at a different device of the memory device 103 as compared to one or more other data symbols of the set of data symbols 120, such as by storing the first data symbol 122 to the first device 106 and by storing the second data symbol 124 to the second device 108, as an illustrative example.

The controller 130 may cause the memory device 103 to access a representation of the codeword 140, such as in response to a request for read access from the device 180. The controller 130 may send a read command to cause the memory device 103 to sense data at the memory device 103. As an illustrative example, the controller 130 may send a read command to cause the memory device 103 to sense a representation 112 of the first data symbol 122 (e.g., a version of the first data symbol 122 that may differ from the first data symbol 122 due to one or more errors). The memory device 103 may provide the representation 112 of the first data symbol 122 to the controller 130.

In some circumstances, the controller 130 may detect an erasure event associated with one or more data symbols of the set of data symbols 120. For example, the controller 130 may detect an erasure event associated with the first data symbol 122 in response to failure of the first device 106. In some implementations, the memory device 103 may return an error message to the controller 130 in response to the read command from the controller 130 (instead of providing the representation 112 of the first data symbol 122). In another example, the representation 112 may include corrupted data.

In response to detecting an erasure event associated with the first data symbol 122, the controller 130 may access each other data symbol of the first subset of the set of data symbols 120. For example, since the first subset includes the first data symbol 122 and the second data symbol 124, the controller 130 may send a read command to the memory device 103 to cause the memory device 103 to provide the second data symbol 124 (or a representation of the second data symbol 124) to the controller 130. The controller 130 may also access one or more partial parity symbols of the set of partial parity symbols 170 associated with the first subset, such as the first partial parity symbol 172.

The controller 130 may input the second data symbol 124 and the first partial parity symbol 172 to the erasure correcting code engine 132 to initiate a process to recover the first data symbol 122. For example, the decoder 136 may be configured to recover the first data symbol 122 using the second data symbol 124 and the first partial parity symbol 172 associated with the first subset of data symbols without also accessing the third data symbol 126 and the second partial parity symbol 174. Thus, fewer memory access operations may be performed (e.g., as compared to accessing each portion of the codeword 140). In some cases, if a number of erasures in the first subset of data symbols exceeds an erasure correcting capability of the first partial parity symbol 172, then the third data symbol 126 and the second partial parity symbol 174 may also be accessed to enable enhanced correction capability.

Figure 2:
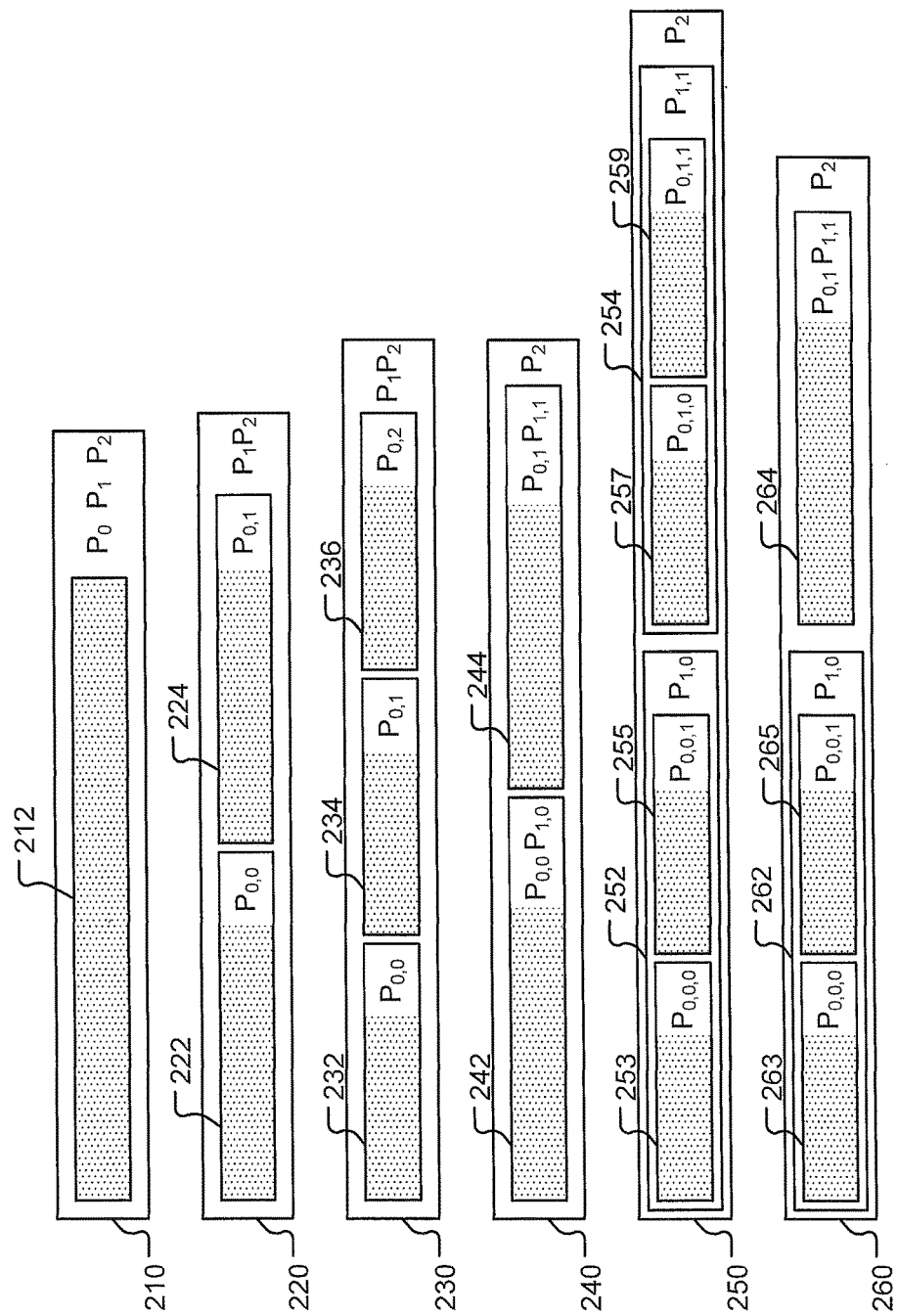
FIG. 2 is a diagram illustrating particular aspects of an example of an erasure correcting code and parity splitting schemes associated with the erasure correcting code.

FIG. 2 depicts particular aspects of an example of an erasure correcting code and parity splitting schemes associated with the erasure correcting code. The erasure correcting code and parity splitting schemes described with reference to FIG. 2 may be used by the controller 130 of FIG. 1. The examples of FIG. 2 correspond to an illustrative t=3 implementation (where t indicates a "maximum" number of erasures correctable using the erasure correcting code). In other examples, t may have a different value. Further, it is noted that the parity splitting schemes depicted in FIG. 2 are illustrative and other parity splitting schemes are also within the scope of the disclosure.

FIG. 2 illustrates an example of a codeword 210 of an erasure correcting code. The codeword 210 may correspond to the codeword 140 of FIG. 1 prior to splitting one or more parity symbols of the parity symbols 144 to generate the set of partial parity symbols 170. For example, the codeword 210 may include a set of data symbols 212 corresponding to the set of data symbols 120 of FIG. 1 and may further include a set of parity symbols $p_0$, $p_1$, and $p_2$ corresponding to the parity symbols 144 of FIG. 1. In other examples, a different number of parity symbols may be used. As an example, in an illustrative t=4 implementation, the codeword 210 may further include a parity symbol $p_3$.

FIG. 2 also depicts a codeword 220 in which a parity symbol $p_0$ of the codeword 210 has been "split" into partial parity symbols $p_{0,0}$ and $p_{0,1}$. The partial parity symbol $p_{0,0}$ may be generated based on a first subset 222 of the set of data symbols 212, and the partial parity symbol $p_{0,1}$ may be generated based on a second subset 224 of the set of data symbols 212.

In other examples, a parity symbol may be split into more than two partial parity symbols. To illustrate, a codeword 230 may include partial parity symbols $p_{0,0}$, $p_{0,1}$, and $p_{0,2}$. The partial parity symbol $p_{0,0}$ may be generated based on a first subset 232 of the set of data symbols 212, the partial parity symbol $p_{0,1}$ may be generated based on a second subset 234 of the set of data symbols 212, and the partial parity symbol $p_{0,2}$ may be generated based on a third subset 236 of the set of data symbols 212.

In some examples, a subset of data symbols may be associated with multiple partial parity symbols, such as if multiple parity symbols of the set of parity symbols $p_0$, $p_1$, and $p_2$ are split. To illustrate, a codeword 240 includes partial parity symbols $p_{0,0}$, $p_{1,0}$, $p_{0,1}$, and $p_{1,1}$. The partial parity symbols $p_{0,0}$ and $p_{0,1}$ may be split from the parity symbol $p_0$, and the partial parity symbols $p_{1,0}$ and $p_{1,1}$ may be split from the parity symbol $p_1$. The partial parity symbols $p_{0,0}$ and $p_{1,0}$ may be associated with a first subset 242 of the set of data symbols 212, and the partial parity symbols $p_{0,1}$ and $p_{1,1}$ may be associated with a second subset 244 of the set of data symbols 212.

Alternatively or in addition, one or more partial parity symbols may be split (e.g., to create partial-partial parity symbols). To illustrate, a codeword 250 may include a partial parity symbol $p_{1,0}$ associated with a first subset 252 and may further include a partial parity symbol $p_{1,1}$ associated with a second subset 254. The partial parity symbols $p_{1,0}$ and $p_{1,1}$ may be split from the parity symbol $p_1$. The codeword 250 may also include a partial-partial parity symbol $p_{0,0,0}$ associated with a first subset 253 and a partial-partial parity symbol $p_{0,0,1}$ associated with a second subset 255. The codeword 250 may further include a partial-partial parity symbol $p_{0,1,0}$ associated with a subset 257 of the second subset 254 and a partial-partial parity symbol $p_{0,1,1}$ associated with a second subset 259 of the second subset 254.

In some examples, "unequal" protection may be applied to data symbols of a codeword. For example, a codeword 260 may include a first subset 262 and a partial parity symbol $p_{1,0}$ associated with the first subset 262. The codeword 260 may also include a partial-partial parity symbol $p_{0,0,0}$ associated with a first subset 263 of the first subset 262 and a partial-partial parity symbol $p_{0,0,1}$ associated with a second subset 265 of the first subset 262. The codeword 260 may further include partial parity symbols $p_{0,1}$ and $p_{1,1}$ associated with a second subset 264. The codeword 260 illustrates an example in which the partial parity symbols $p_{0,1}$ and $p_{1,1}$ are not split into partial-partial parity symbols. Thus, the subsets 262 and 264 may be protected "unequally."

FIG. 3 illustrates an example of the parity check matrix 142 ("H"). In the illustrative example of FIG. 3, t=4. In other cases, t may have a different value. Further, although certain examples herein are described with reference to a Vandermonde matrix, in other implementations, a different systematic H matrix may be used instead of a Vandermonde matrix.

In the example of FIG. 3, the parity check matrix 142 includes a first set of columns ("A") associated with data symbols $d_0$, $d_1$, $d_2$, $d_3$, $d_4$, $d_5$, $d_6$, $d_7$, $d_8$, $d_9$, $d_{10}$, and $d_{11}$ (e.g., the data symbols 120 of FIG. 1) and further includes a second set of columns (an identity matrix, "I") associated with parity symbols $p_0$, $p_1$, $p_2$, and $p_3$. Each entry of the first set of columns includes an exponentiation of a coefficient (e.g., $\alpha^0=1$, $\alpha^1=\alpha$, $\alpha^2$, etc.).

The example of FIG. 3 indicates that the data symbols $d_{0-11}$ may be divided into subsets in multiple levels. Each level of division is represented by one or more groups covering the same number of rows, but different columns of the parity check matrix 142. To illustrate, a first level division of data set is illustrated by two groups covering the first three rows of the parity check matrix 142, a second level division of data subset is indicated by the groups covering the first two rows of the parity check matrix, and a third level division of data subset is shown by the groups covering the first row of the parity check matrix. In other cases, data subset division may be performed differently than as illustrated in the example of FIG. 3.

A particular subset of the data symbols $d_0$-$d_{11}$ and a particular level of the parity check matrix 142 may define a group of coefficients of the parity check matrix 142. For example, a subset $d_0$-$d_5$ and a first level may define a group 312. As another example, a subset $d_6$-$d_{11}$ and the first level may define a group 314. A subset $d_0$-$d_2$ and the second level may define a group 316, and a subset $d_3$-$d_5$ and the second level may define a group 318. A subset $d_6$-$d_9$ and the second level may define a group 320, and a subset $d_{10}$-$d_{11}$ and the second level may define a group 322.

FIG. 4 depicts an illustrative example of the encoder 134. The encoder 134 may include an adder circuit 402, a multiplier circuit 404, and a register 406 coupled to the adder circuit 402 and to the multiplier circuit 404. The encoder 134 of FIG. 4 may correspond to a Vandermonde matrix implementation of the parity check matrix 142. It should be appreciated that the example of FIG. 4 is illustrative and that other implementations are within the scope of the disclosure. For example, the encoder 134 may have a different configuration, such as if a systematic parity check matrix other than using a Vandermonde matrix is implemented as the parity check matrix 142.

The adder circuit 402 may be configured to receive a first subset of a set of data symbols, such as the set of data symbols 120 of FIG. 1. In the example of FIG. 4, the set of data symbols 120 includes data symbols $d_0$, . . . $d_{k-2}$, $d_{k-1}$. The multiplier circuit 404 may be configured to receive exponentiations of coefficients (e.g., $\alpha^i$) of the parity check matrix 142 of FIG. 1.

The register 406 may be configured to receive a reset signal 410 to reset a state of the register 406 prior to processing of a second subset of the set of data symbols by the adder circuit 402 to enable separate encoding of multiple subsets of the set of data symbols 120. For example, a reset input 408 of the register 406 may be configured to receive the reset signal 410 to reset the state of the register 406 to initialize the register 406 for processing of the second subset of the set of data symbols 120. The register 406 may be further configured to output a first parity symbol $p_i$ associated with the first subset. For example, to encode subsets associated with the second level of FIG. 3, the reset signal 410 may be applied after receiving (or processing) the data symbol $d_2$ at the encoder 134, after receiving (or processing) the data symbol $d_5$ at the encoder 134, and after receiving (or processing) the data symbol $d_9$ at the encoder 134 to enable generation of partial parity symbols for the groups 316, 318, 320, and 322.

Figure 5:
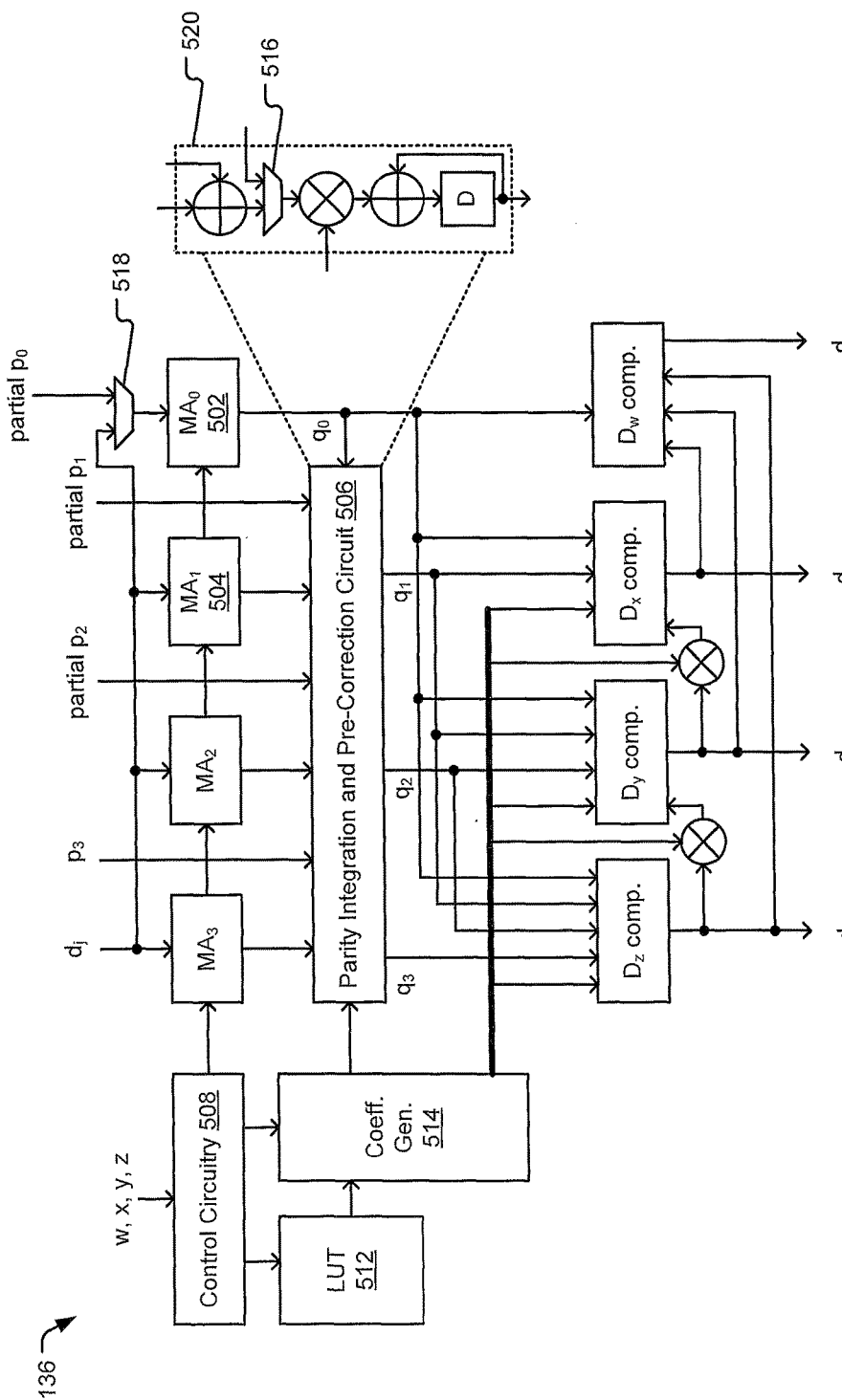
FIG. 5 is a diagram illustrating particular aspects of an example of a decoder configured to recover one or more data symbols associated with an erasure correcting code.

FIG. 5 depicts an illustrative example of the decoder 136. The decoder 136 of FIG. 5 may correspond to a Vandermonde matrix implementation of the parity check matrix 142. It should be appreciated that the example of FIG. 5 is illustrative and that other implementations are within the scope of the disclosure. For example, the decoder 136 may have a different configuration, such as if a systematic parity check matrix other than using a Vandermonde matrix is implemented as the parity check matrix 142.

The decoder 136 may include a set of multiply-add (MA) circuits, such as a first MA circuit 502 and a second MA circuit 504. The decoder 136 also includes a parity integration and pre-correction circuit 506 coupled to the set of MA circuits. The decoder 136 may also include control circuitry 508, a lookup table (LUT) 512, and a coefficient generator 514. The LUT 512 may correspond to the information 138 of FIG. 1. An MA circuit illustrated in FIG. 5 may correspond to the encoder 134 of FIG. 4 (e.g., an MA circuit of FIG. 5 may include an adder circuit, a multiplier circuit, and a register, such as illustrated in the example of FIG. 4).

The first MA circuit 502 may be configured to receive a first data symbol and to generate a first output based on the first data symbol. The second MA circuit 504 may be configured to receive the first data symbol and to generate a second output based on the first data symbol. The parity integration and pre-correction circuit 506 is configured to update the second output based on the first output. For example, the parity integration and pre-correction circuit 506 may include a multiplexer (MUX) 516 configured to select a corrected data value from the first output and to update the second output by inserting the corrected data value at the second output. The MUX 516 may be included in a circuit 520 of the parity integration and pre-correction circuit 506, and the parity integration and pre-correction circuit 506 may include multiple copies of the circuit 520 each coupled to a corresponding MA circuit of the decoder 136.

The decoder 136 may also include a MUX 518 coupled to the first MA circuit 502. The MUX 518 may be configured to select one of a data value and a partial parity symbol and to provide the data value or the partial parity symbol to the first MA circuit 502.

Figure 6:
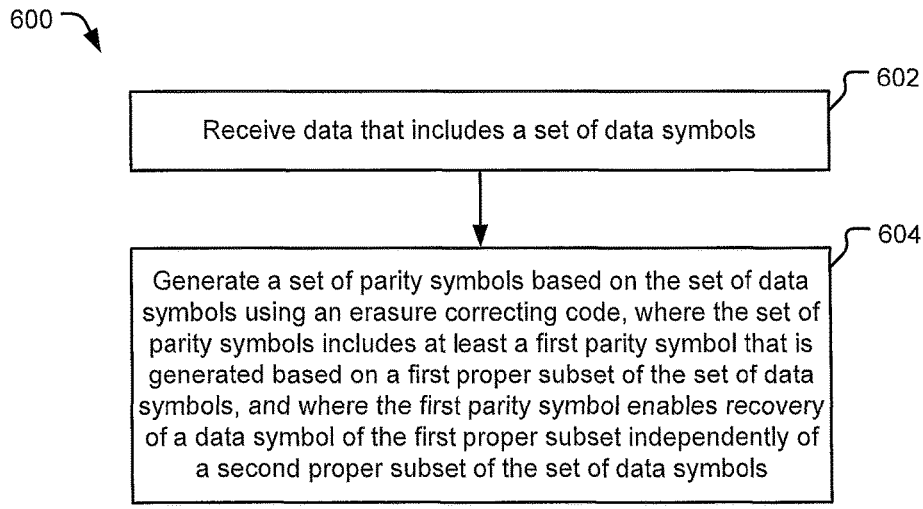
FIG. 6 is a flow chart of an example of a method of encoding data subsets to generate partial parity symbols associated with an erasure correcting code.

Referring to FIG. 6, a particular illustrative example of a method is depicted and generally designated 600. The method 600 may be performed at a device, such as at the device 102 of FIG. 1.

The method 600 includes receiving data that includes a set of data symbols, at 602. The data may correspond to the data 160 of FIG. 1 or a version of the data 160 that is generated by the controller 130 based on the data 160, and the set of data symbols may correspond to the set of data symbols 120 of FIG. 1, as illustrative examples.

The method 600 further includes generating a set of parity symbols based on the set of data symbols using an erasure correcting code, at 604. The set of parity symbols includes at least a first parity symbol that is generated based on a first subset of the set of data symbols, and the first parity symbol enables recovery of a data symbol of the first subset independently of a second subset of the set of data symbols. To illustrate, the set of parity symbols may correspond to the set of partial parity symbols 170 of FIG. 1, and the first parity symbol may correspond to the first partial parity symbol 172 of FIG. 1. The first subset may correspond to a subset of the set of data symbols 120, such as the data symbols 122 and 124, as an illustrative example. In this example, the second subset may include the third data symbol 126, one or more other data symbols, or a combination thereof. Each data symbol of the second subset may be excluded from the first subset.

The first parity symbol and at least a second parity symbol of the set of parity symbols may correspond to partial parity symbols of a particular parity symbol associated with the erasure correcting code. As illustrative, non-limiting examples, FIGS. 2 and 3 illustrate that the parity symbol $p_0$ may be split to form the partial parity symbols $p_{0,0}$ and $p_{0,1}$, the partial parity symbols $p_{0,0}$, $p_{0,1}$, and $p_{0,2}$, the partial parity symbols $p_{0,0,0}$, $p_{0,0,1}$, $p_{0,1,0}$, and $p_{0,1,1}$, or the partial parity symbols $p_{0,0,0}$, $p_{0,0,1}$, and $p_{0,1}$. Alternatively or in addition, the parity symbol $p_1$ may be split to form the partial parity symbols $p_{1,0}$ and $p_{1,1}$, as depicted with reference to FIGS. 2 and 3. Alternatively or in addition, the parity symbol $p_2$ may be split to form partial parity symbols associated with the groups 312, 314 of FIG. 3.

The set of parity symbols may further include a second parity symbol (e.g., the second partial parity symbol 174) that is generated based on a third subset of the set of data symbols. In some examples, the third subset is included in the first subset. To illustrate, the subsets 253, 255 are included in the first subset 252, and the subsets 257, 259 are included in the second subset 254. As another example, the subsets 263, 265 are included in the first subset 262. To further illustrate, FIG. 3 depicts that the groups 316, 318 are included in the group 312. In other examples, the third subset is larger than the first subset. In another example, the first subset may be the same as the third subset (i.e., the first subset and the third subset may include the same data symbols in some cases).

In some examples, the first subset and the third subset are associated with different levels (e.g., different sets of one or more rows) of the parity check matrix 142. To illustrate, the subsets 253, 255, 257, and 259 are associated with a different level as compared to the subsets 252, 254. As another example, the subsets 263, 265 are associated with a different level as compared to the first subset 262. To further illustrate, FIG. 3 depicts that the groups 316, 318 are associated with a different level as compared to the group 312. Each of the groups 316, 318 also includes one or more subsets that are associated with a different level as compared to the groups 316, 318. In other examples, the third subset is associated with a common level (e.g., a common set of one or more rows) of the parity check matrix 142.

A cardinality of the first subset may be the same as a cardinality of the third subset. In this case, a number of data symbols of the first subset corresponds to a number of data symbols of the third subset. In other examples, a cardinality of the first subset is different than a cardinality of the third subset.

The method 600 may optionally include dividing the data into multiple subsets associated with different levels, where the multiple subsets include the first subset and the second subset. For example, the controller 130 may divide the set of data symbols 120 into multiple subsets, such as the first subset, the second subset, and the third subset.

The method 600 may optionally include generating an erasure correcting codeword based on the first subset and the second subset, such as by generating the codeword 140. The method 600 may optionally include sending the set of data symbols and the set of parity symbols to one or more devices of a DSS. For example, the controller 130 may send the codeword 140 to the memory device 103 for storage at one or more devices of the memory device 103.

Figure 7:
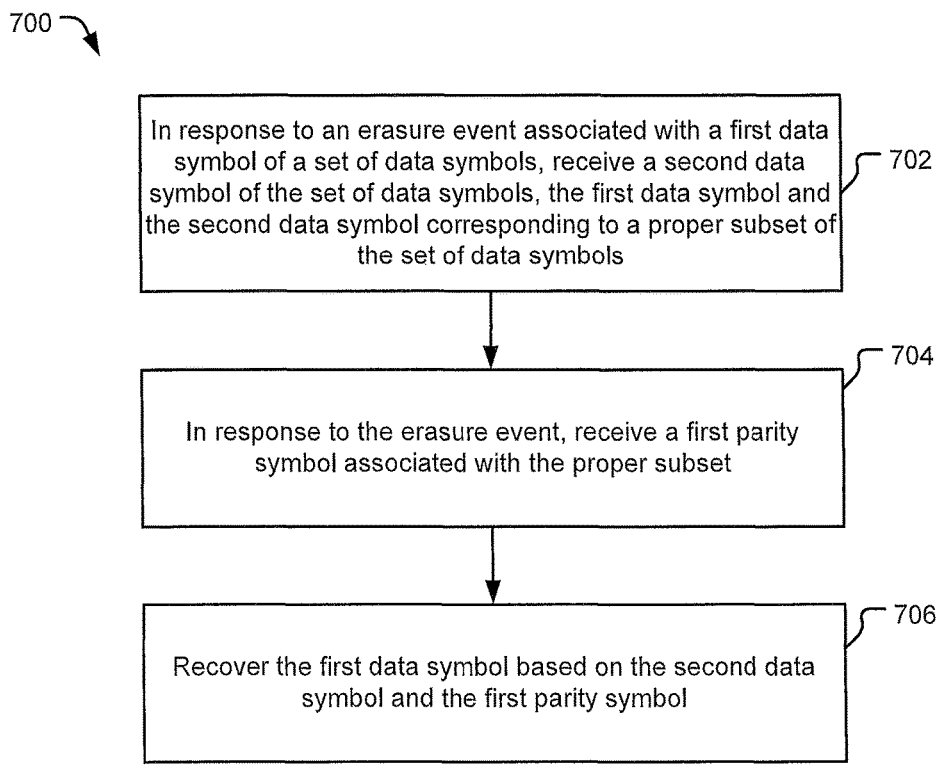
FIG. 7 is a flow chart of an example of a method of decoding data using partial parity symbols associated with an erasure correcting code.

Referring to FIG. 7, a particular illustrative example of a method is depicted and generally designated 700. The method 700 may be performed at a device, such as at the device 102 of FIG. 1.

The method 700 includes receiving a second data symbol of a set of data symbols in response to an erasure event associated with a first data symbol of the set of data symbols, at 702. The first data symbol and the second data symbol correspond to a proper subset of the set of data symbols. To illustrate, the controller 130 may receive the second data symbol 124 in response to an erasure event associated with the first data symbol 122, as described with reference to FIG. 1. The first data symbol 122 and the second data symbol 124 may be associated with a proper subset of the set of data symbols 120 (e.g., the first subset described with reference to FIG. 1).

The method 700 further includes receiving a first parity symbol associated with the proper subset, at 704. For example, the controller 130 may receive the first partial parity symbol 172, and the first partial parity symbol 172 may be associated with a proper subset of the set of data symbols 120 (where the proper subset includes the first data symbol 122 and the second data symbol 124).

The method 700 further includes recovering the first data symbol based on the second data symbol and the first parity symbol, at 706. For example, recovering the first data symbol may include performing an exclusive-or (XOR) operation based at least in part on the second data symbol and the first parity symbol by the parity integration and pre-correction circuit 506. The XOR operation may be based further on an exponentiation of a coefficient of the parity check matrix 142 (e.g., for partial parity values of $p_1$ and partial parity values of $p_2$).

In an illustrative example, the second data symbol is further associated with a second proper subset of the set of data symbols, and the method 700 further includes receiving a third data symbol associated with the second proper subset prior to recovering the first data symbol and receiving a second parity symbol associated with the second proper subset prior to recovering the first data symbol. In this example, the method 700 may also include recovering the second data symbol based on the third data symbol and the second parity symbol. As an illustrative example, a particular data symbol of the second subset 254 may be recovered (e.g., in response to an erasure event of the particular data symbol) based on other data symbols of the second subset 254 and further based on the partial parity symbol $p_{1,1}$. If the particular data symbol is included in a smaller subset that is within the second subset 254 (e.g., the subset 257 or the subset 259), then the third data symbol and the second parity symbol may be selected based on the smallest subset that includes the particular parity symbol (e.g., by using the subset 257 and the partial parity value $p_{0,1,0}$ or the subset 259 and the partial parity symbol $p_{0,1,1}$ instead of using the second subset 254 and the partial parity symbol $p_{1,1}$).

The method 700 may optionally include accessing information in response to the erasure event to determine that the first data symbol is associated with the second data symbol. For example, the information may correspond the information 138, the LUT 512, or both. The information may indicate a mapping of data symbols to subsets or boundaries of subsets of data symbols (e.g., that the data symbols $d_0$ and $d_5$ form boundaries of a subset associated with the first level, as depicted in the example of FIG. 3).

The information may indicate that the first data symbol is included in multiple subsets of the set of data symbols, and the method 700 may include selecting the second data symbol in response to determining that the subset is of a lower cardinality than other subsets of the multiple subsets. For example, if the second data symbol is included in the subset 257 (and the second subset 254), then the controller 130 may select the subset 257 instead of the second subset 254 in response to determining that the subset 257 is of a lower cardinality of the second subset 254.

Erasure codes may be adopted to achieve reliable data storage. For large-scale distributed storage, besides redundancy, locality (e.g., the number of data and parity symbols accessed for failure recovery) may be reduced to increase data availability, lower network traffic, and reduce recovery latency. Aspects in accordance with the present disclosure describes may enable a flexible and low-complexity scheme for local erasure recovery. A code in accordance with the disclosure may have a reduced number of constraints associated with locality and/or a reduced number of parameters of the code as compared to certain other locally recoverable codes. The code may enable an easy tradeoff on the locality and redundancy and may achieve unequal protection over drives with different reliability. In addition, a code in accordance with the disclosure may feature a reduced computational overhead as compared to other erasure codes that do not support local recovery when the erasure-correction capability is relatively small (such as 2, 3, or 4).

Cloud computing and big data applications may use distributed storage system that can recover from several failures. Erasure codes may be used to recover from failures. In addition to redundancy, locality in terms of the number of symbols to access to recover erasures may affect data availability, network traffic, recovery latency for large-scale distributed systems.

Certain systems use Reed-Solomon (RS) codes, EVENODD codes, and other similar array codes for addressing disk failures. These codes may be maximum distance separable (MDS) codes, and they may feature a relatively small amount of redundancy as compared to certain other codes. In these codes, for an (n, k) code, k symbols may be used for recovery (regardless of the actual erasure number). In most cases, there are fewer failures than the designed "maximum" correction capability t. To improve the locality in these cases, diagonal parities may be used to reduce the number of symbols used to recover from a single failure in EVENODD codes by around ¼. As in certain classical EVENODD codes, this scheme has t=2, and the applicable n and k may be limited. Rotated RS and piggybacking frameworks may spread symbols across multiple stripes of existing codes and may correspond to MDS codes (if the underlying codes are MDS). These codes may be associated with certain constraints on the code parameters, and locality improvement of these codes may depend on the positions of the failed disks. Certain other codes may use expensive polynomial evaluation and interpolation over finite fields for encoding and decoding.

A technique in accordance with the disclosure uses a flexible yet low-complexity scheme for local erasure recovery using systematic parity check matrices of maximum distance separable (MDS) codes. Data symbols may be divided into multiple levels of subsets. The subsets in upper levels may be appended with more parities and hence may address more erasures. In an illustrative example, to recover from failures, only the symbols in the smallest subset with sufficient erasure-correction capability are used for recovery. As a result, significant locality reduction may be achieved. Although a code in accordance with the disclosure may not be MDS, such a code may not be associated with constraints on the code parameters and may not be associated with constraints on the cardinalities of the subsets (and hence locality reduction). Further, the subsets in the same level can be of different sizes. This aspect may enable unequal protection over heterogeneous drives with different reliability. A tradeoff on the locality and redundancy may be achieved through adjusting the number of levels of the subsets and cardinalities of the subsets.

An erasure-correction capability to be achieved in connection with certain systems may be relatively small, such as 2, 3, or 4, and a code in accordance with the disclosure may use Vandermonde matrices to generate parities. The Vandermonde matrices may enable efficient encoder and decoder implementations. For example, erasure recovery may be performed based on linear equations, which may be associated with a lower complexity than certain erasure-only Berlekamp-Massey Algorithm (BMA) techniques for RS decoding.

A minimum distance of an (n, k) linear block code may be at most n−k+1. When this bound is achieved, the code may be referred to as MDS, and a MDS code may be t=n−k erasure-correcting. Linear block codes may be defined by a parity check matrix H. A systematic parity check matrix H may have a format of H=[N|I]. A may be an (n−k)×k matrix, and I may be an (n−k)×(n−k) identity matrix. The corresponding codewords may include data symbols followed by parity symbols. A code corresponding to such a parity check matrix may be MDS if and only if each square submatrix formed by any i rows and any i columns for any i=1, 2, . . . , min{k, n−k} of A is nonsingular. A matrix that satisfies this condition is the Cauchy matrix, in which the entries are $1/(x_i, y_j)$, where $(x_i)$ and $(y_j)$ are sequences of distinct finite field elements, and where $x_i \neq y_j$ for $0 \leq i < (n-k)$ and $0 \leq j < k$. In some circumstances, encoding and decoding according to this matrix may have relatively high complexity. In some implementations, individual drives may be sufficiently reliable so that a large number of failures is relatively unlikely. If the erasure-correction capability, t, is relatively small (e.g., 2, 3, or 4), the Vandermonde matrix may be used as the A matrix for constructing MDS codes in order to simplify an encoder and a decoder. Such a parity check matrix for t-erasure correction may have the format $$H_t^{(V)} = [A_t^{(V)} | I] = \begin{bmatrix} 1 & 1 & \ldots & 1 & 1 & 0 & \ldots & 0 \\ \alpha^0 & \alpha^1 & \ldots & \alpha^{k-1} & 0 & 1 & \ldots & 0 \\ \alpha^0 & \alpha^2 & \ldots & \alpha^{2(k-1)} & 0 & 0 & \ldots & 0 \\ \vdots & \vdots & \ddots & \vdots & \vdots & \vdots & \ddots & 0 \\ \alpha^0 & \alpha^{(t-1)} & \ldots & \alpha^{(t-1)(k-1)} & 0 & 0 & \ldots & 1 \end{bmatrix}$$

where $\alpha$ may indicate a primitive element of a finite field $GF(2^r)$ ($k \leq 2^r - 1$). Since $\alpha^i \neq \alpha^j$ and $\alpha^{2i} \neq \alpha^{2j}$ for $i \neq j$, all square submatrices in $A_2^{(V)}$ and $A_3^{(V)}$ are nonsingular. Hence, $H_2^{(V)}$ and $H_3^{(V)}$ may correspond to parity check matrices of MDS codes with t=2 and t=3, respectively, whose k can be any value less than $2^r$. $H_2^{(V)}$ and $H_3^{(V)}$ may correspond to the parity check matrices for a RAID-6 and triply-extended RS code. For Vandermonde matrices with four or more rows, a maximum number of columns in which there is no singular square submatrices may correspond to the maximum k of the MDS codes that can be constructed. The maximum k may depend on $\alpha$ or the primitive polynomial of which it is a root. For $GF(2^8)$, the maximum k may be 27 for 4-erasure correction, and this value may be increased to 67 if the code is constructed over $GF(2^{10})$. The maximum k may be less for larger t since a Vandermonde matrix with more rows is more likely to have singular submatrices.

A flexible scheme in accordance with the disclosure may use a fraction of the codeword symbols for recovery in cases in which the erasure number is smaller than t. The scheme may be applied to any systematic parity check matrix, such as a scheme that uses a Cauchy matrix. In some circumstances, use of the Vandermonde matrix may result in lower complexity encoding and decoding.

H=[A|I] may correspond to a parity check matrix of a (k+t, k) MDS code, which is t-erasure-correcting. The entries of A may be indicated as $a_{i,j}$ ($0 \leq i < t$, $0 \leq j < k$), the data symbols may be indicated by $d_0, d_1, \ldots, d_{k-1}$, and the parity symbols may be indicated by $p_0, p_1, \ldots, p_{t-1}$. In this example, $$p_i = \sum_{j=0}^{k-1} a_{i,j} d_j, .$$ (Equation 1)

In certain conventional devices, if one erasure occurs associated with location j, data symbol $d_j$ may be recovered based on:

$$p_0 + \sum_{j'=0, j' \neq j}^{k-1} a_{0,j'} d_{j'}.$$

Such a device may access each of the other data symbols and $p_0$. In response to i erasures, recovery may be performed based on i linear equations specified by the first i rows of H using the other data symbols and $p_0, p_1, \ldots p_{i-1}$. Locality may be defined as a number of symbols (including data symbols and parity symbols) accessed to in order to recover symbols of a particular number of erasures. In certain conventional devices, locality may be k−i+i=k regardless of the number of erasures.

If H is the parity check matrix of a (k+t, k) MDS code, then any k'<k columns of A and I (where I includes t rows and t columns) form the parity check matrix of a (k'+t, k') MDS code, which is t-erasure-correcting. Therefore, instead of involving all data symbols in each parity, the data symbols may be divided into subsets, and parities may be generated for each subset to achieve local erasure recovery. Such a technique may include "breaking up" a code into independent pieces and generating t parities for each subset, which causes large storage overhead. Further, most instances of failures may include a relatively small number of erasures (e.g., much smaller than t). In this case, the failures may be recovered based on fewer linear equations involving fewer rows of H. Accordingly, subset division and parity padding may be performed in a hierarchical manner.

To enable t-erasure correction, all data symbols may be included in the $p_{t-1}$ parity. Further, $p_0, p_1, \ldots, p_{t-2}$ may be "split" into partial parities, and each partial parity may be generated based on a subset of the data symbols. If the k data symbols are divided into $l_0$ subsets $S_j$ ($0 \leq j < l_0$), then $p_i$ ($0 \leq i < t-2$) may be split into $p_{i,0}, p_{i,1}, \ldots, p_{i,l_0-1}$. $P_{i,j}$ may be determined based on the first i+1 rows of H in the columns corresponding to the subset $S_j$. Since any columns in the first t−1 rows of A padded with $I_{(t-1) \times (t-1)}$ may form the parity check matrix of a code with a minimum distance t, then t−1-erasure correction may be facilitated for the data symbols in $S_j$ using $p_{0,j}, p_{1,j}, \ldots, p_{t-2,j}$. If $p_i$ (i=0, 1, . . . , t−2) are needed for t-erasure correction, $p_i$ may be generated by determining a sum of the partial parities based on:

$$p_i = \sum_{j=0}^{l_0-1} p_{i,j}.$$

Further, $S_j$ may be further divided into $l_{1,j}$ subsets $S_{j,m}$ ($0 \leq m < l_{1,j}$), and $p_{i,j}$ ($0 \leq i \leq t-3$) may be further split into $p_{i,j,m}$ (m=0, 1, . . . , $l_{1,j-1}$). The data symbols in $S_{j,m}$ and the t−2 parities $p_{i,j,m}$ ($0 \leq i \leq t-3$) may be t−2-erasure-correcting. $P_{i,j,m}$ may be summed to recover $p_{i,j}$ for correcting more erasures. This parity splitting process may be iterated. A device in accordance with the disclosure may include circuitry configured to generate the partial parities, to use the partial parities for erasure recovery, or both.

In some examples, redundancy and locality may be "tuned" by changing the number of levels and cardinalities of the subsets. Smaller subsets may be associated with reduced locality and also with more subsets (and more parities). Advantageously, cardinalities of the subsets in a particular level may be unequal. For example, one or more data symbols with higher failure probabilities may be allocated more parities to increase protection as compared to one or more data symbols with lower failure probabilities.

FIG. 2 shows examples of a parity splitting scheme for t=3. In FIG. 2, shaded areas indicate data symbols, and parities within a rectangle are generated for data symbols in the same rectangle. For each example of FIG. 2, Table 1 lists illustrative redundancy and locality in terms of the number of symbols accessed to recover all erasures (assuming the erasures are on the data symbols).

TABLE 1

| | # of parities | locality for correcting | | |
|---|---|---|---|---|
| | | 1 erasure | 2 erasures | 3 erasures |
| (a) | 3 | k | k | k |
| (b) | 4 | k/2 | k | k |
| (c) | 5 | k/3 | 2k/3 (1, 1) | k |
| | | | k (2, 0) | |
| (d) | 5 | k/2 | k/2 (2, 0) | k |
| | | | k (1, 1) | |
| (e) | 7 | k/4 | k/2 | k/2 (2, 1, 0, 0) |
| | | | | 3k/4 (1, 1, 1, 0) |
| | | | | 3k/4 (2, 0, 1, 0) |
| | | | | k (3, 0, 0, 0) |
| (f) | 6 | k/3 | k/3 (0, 0, 2) | 2k/3 (2, 1, 0) |
| | | | 2k/3 (1, 0, 1) | 2k/3 (1, 0, 2) |
| | | | 2k/3 (1, 1, 0) | k (1, 1, 1) |
| | | | 2k/3 (2, 0, 0) | k (2, 0, 1) |
| | | | | k (3, 0, 0) |
| | | | | k (0, 0, 3) |

In the case that the locality differs with the erasure pattern, the digits in parentheses in Table 1 indicate the numbers of erasures in the last-level data subsets. In Table 1, scheme (a) may correspond to the codeword 210, scheme (b) may correspond to the codeword 220, scheme (c) may correspond to the codeword 230, scheme (d) may correspond to the codeword 240, scheme (e) may correspond to the codeword 250, and scheme (f) may correspond to the codeword 260.

To further illustrate, the codeword 250 of FIG. 2 includes four data subsets (the subsets 253, 255, 257, and 259) in the last level. In this example, if three erasures occur and the erasures are associated with different last-level subsets (denoted by (1, 1, 1, 0) in Table 1), then Table 1 indicates that 3k/4 data and parity symbols may be accessed for recovery of the three erasures.

In scheme (b), by splitting data symbols into two subsets and dividing $p_0$ into two partial parity symbols, a single erasure may be recoverable by accessing k/2-1 data symbols and one parity symbol. Locality for correcting two or more erasures may correspond to k. By including more subsets and/or by allocating more parities to lower level subsets, locality for correcting two or more erasures may be improved, as indicated in schemes (c)-(f).

Erasures may be corrected using only the symbols in the smallest subsets with sufficient erasure-correction capability. To illustrate, if two erasures in $S_{0,0}$ and one erasure in $S_{0,1}$ occur in connection with scheme (e), then the erasure in $S_{0,1}$ may be corrected using $p_{0,0,1}$ and other data symbols in $S_{0,1}$. After recovering the erasure in $S_{0,1}$, erasures in $S_{0,0}$ may be corrected using $p_{0,0,0}$, $p_{1,0}$, and other data symbols in $S_{0,0}$ and $S_{0,1}$. In this example, locality may correspond to k/4−1+1+k/4−2+1+1=k/2.

Scheme (f) illustrates an example of "unequal" protection. "Unequal" protection may be applied to increase protection for one or more devices associated with higher probability of failure as compared to one or more other devices. In an illustrative example, data symbols of the first subset 262 are stored at one or more devices of the memory device 103 that have a first reliability, and data symbols of the second subset 264 are stored at one or more devices of the memory device 103 that have a second reliability that is less than the first reliability.

In some cases, a technique in accordance with the disclosure may be used to correct more erasures than t. For example, seven erasures with an erasure pattern (3, 1, 2, 1) (e.g., where three erasures occur in the first subset 253, one erasure occurs in the subset 255, two erasures occur in the subset 257, and one erasure occurs in the subset 259) may be corrected in accordance with scheme (e).

FIG. 2 shows certain examples that may be used based on probability and distribution of erasures. Although the examples of FIG. 2 correspond to t=3, in other examples t≥4.

Certain illustrative encoder and decoder implementation architectures may be configured to operate in accordance with Vandermonde matrices. For Vandermonde matrices, the parity computation may be performed based on:

$$p_i = \Sigma_{j=0}^{k-1} \alpha^{ij} d_j.$$

To increase throughput, multiple data symbols to be written to a device of the memory device 103 may be processed in each clock cycle. The multiple data symbols may belong to different codewords (e.g., the codeword 140 and one or more other codewords), and multiple encoders (e.g., the encoder 134 and one or more other encoders) may be used, where one encoder processes one data symbol at a time. Instead of a general finite field multiplier, a "constant" multiplier (e.g., the multiplier circuit 404) may be used to reduce a number of logic gates. To reduce encoder complexity, Horner's rule is applied so that:

$$p_i = \alpha^i ( \ldots (\alpha^i(\alpha^i d_{k-1} + d_{k-2}) + d_{k-3} \ldots + d_1) + d_0.$$

Accordingly, an encoder (e.g., the encoder 134) may be implemented using a feedback loop (e.g., as illustrated by FIG. 4). To enable parity splitting operations, the register 406 may be reset (e.g., using the reset signal 410) when data of the next subset is input to the encoder 134 (e.g., at the adder circuit 402). In this case, the lower-level parities associated with $p_i$ (i>0) may no longer sum to $p_i$. Accordingly, a decoding process may include multiplying the lower-level parities with $\alpha^{is}$, where s is the total cardinalities of the previous subsets in the same level as the current subset. For example, if each last-level subset has k/3 symbols in scheme (f) of Table 1, then the encoder 134 may be reset at clock cycle 0, at clock cycle k/3, and at clock cycle 2k/3 to generate $p_{0,0,0}$, $p_{0,0,1}$, and $p_{0,1}$. The first MA circuit 502 (or another circuit, such as another MA circuit that operates in parallel with the first MA circuit 502) may be reset at clock cycle 0 and at clock cycle 2k/3 to generate $p_{1,0}$ and $p_{1,1}$. In this example, $$p_1 = p_{1,0} + \alpha^{2k/3} p_{1,1}.$$

During a decoding process, if data to be decoded includes last-level subsets with one erasure, the erasure may be first recovered by XORing the other data symbols and the partial $p_0$ for the same subset. Then contributions of the last-level subsets may be added to the parities to recover the other erasures. This single-erasure pre-correction may reduce locality as compared to other techniques. For example, without pre-correction, a decoding process in accordance with scheme (e) of Table 1 to correct erasures having the pattern (2, 1, 0, 0) may include accessing $p_{0,0,0}$, $p_{0,0,1}$, $p_{1,0}$, $p_2$ and each other (non-erased) data symbol. In this example, the locality may be k+1.

FIG. 5 illustrates an example decoder architecture for t=4. In the example of FIG. 5, erasures may be located at positions w, x, y, and z, and $$q_i = p_i + \Sigma_{j \neq w,x,y,z} \alpha^{ij} d_j \text{ for } 0 \leq i \leq 3.$$

The values $q_i$ may be computed by the MA circuits and the parity integration and pre-correction circuit 506. The MA circuits of FIG. 5 may be as described with reference to the encoder 134 of FIG. 4, except that $d_j$ may be set to zero when j=w, x, y or z. The LUT 512 may store $\alpha^j$ for $0 \leq j < k$, and the coefficient generator 514 may compute all coefficients involving powers of a used by the decoder 136. The parity integration and pre-correction circuit 506 may include three copies of the circuit 520 that connect to $MA_i$ (i=1, 2, 3). The data subsets may be processed out-of-order during decoding due to the parity integration and pre-correction circuit 506.

After each subset is processed at the decoder 136, the parity integration and pre-correction circuit 506 may add the output of $MA_i$ to the partial parity of the same subset, and the sum may be multiplied by $\alpha^{is}$. Such products from different subsets may be accumulated by the adder-register loop of the circuit 520 to generate $q_i$ (i=1, 2, 3). The partial parities of $p_0$ may be added up by a XOR operation performed by the decoder 136, such as by "sharing" the first MA circuit 502 ($MA_0$).

A recovered erasure in a subset (e.g., $d_w$) may be provided at the output of the first MA circuit 502. The recovered erasure may be multiplied with $\alpha^{iw}$ and added to an "intermediate" value, $q_i$ (i=1, 2, 3) by sharing the multipliers and feedback loops in the parity integration and pre-correction circuit 506.

The erasures may be recovered based on linear equations. A device that operates based on properties of the Vandermonde matrix may enable simplification of certain operations. For example, $d_w$, $d_x$, $d_y$, and $d_z$ may be expressed as:

$$\begin{cases} \alpha^{w+x+y} q_0 + (\alpha^{w+x} + \alpha^{w+y} + \alpha^{x+y}) q_1 + \\ \quad (\alpha^w + \alpha^x + \alpha^y) q_2 + q_3 \\ \overline{(\alpha^w + \alpha^z)(\alpha^x + \alpha^z)(\alpha^y + \alpha^z)} \\ d_y = \dfrac{\alpha^{w+z} + q_0 + (\alpha^w + \alpha^x) q_1 + q_2 + }{(\alpha^w + \alpha^y)(\alpha^x + \alpha^y)} \\ \quad \dfrac{(\alpha^w + \alpha^z)(\alpha^x + \alpha^z) d_z}{(\alpha^w + \alpha^y)(\alpha^x + \alpha^y)} \\ d_x = \dfrac{\alpha^w q_0 + q_1 + (\alpha^w + \alpha^y) d_y}{(\alpha^w + \alpha^x)} \\ d_w = q_0 + d_x + d_y + d_z \end{cases}$$ (Equation 2)

If three erasures occur, the decoder 136 may be configured to recover the erasures by performing operations based on the last three formulas in Equation 2 (e.g., without the product terms involving $d_z$). If two erasures occur, the decoder 136 may be configured to recover the erasures by performing operations based on the last two formulas of Equation 2 (e.g., without the product terms involving $d_z$ and $d_y$). The decoder 136 may be configured to recover a single erasure by performing operations based on $d_w = q_0$.

In some examples, erasures belong to different drives and are written back at different clock cycles. In this case, pipelining of operations may be implemented without causing additional latency. Two or more coefficients of Equation 2 may be determined in parallel with $q_i$. For example, determination of $q_i$ may be performed in parallel with determining coefficients by the coefficient generator 514. Because determination of $q_i$ may use a relatively large number of clock cycles, a relatively small number of logic circuits (e.g., multiplier circuits, adder circuits, and registers) may be implemented in the coefficient generator 514 using a time-multiplexing technique.

Erasure correction coding enables recovery from errors that may arise due to physical defects in a non-volatile memory. For example, in NAND flash architectures, storage elements are coupled to word lines (WLs), and a word line defect may result in failure to correctly "program" (i.e., store values into) at least some of the storage elements coupled to the word line. With increasing storage density due to reduced feature size, multiple bits per storage element (e.g., multi-level cell (MLC) or tri-level cell (TLC) storage), and three-dimensional (3D) array architectures, aberrant electrical properties of a word line can result in failures that affects multiple pages of data. For example, storage elements coupled to a single word line of a 3D NAND flash memory may be arranged or logically partitioned into four physical pages (or "strings") of the word line, with each physical page configured to store three logical pages (or "pages") of data in a 3-bit TLC implementation, providing storage capacity for 12 pages of data per word line. Although each page of data may be separately encoded using an error correction code (ECC) to enable correction of one or more bit errors in that page of data, failures due to word line defects (e.g., a broken word line) typically exceed the error correction capability of the ECC code to correct corrupted data.

Erasure coding may encode multiple pages of data so that data of a failed page can be recovered (e.g., re-generated) based on data from the other (non-failed) pages. Continuing the above example of 12 pages per word line, 12 erasure codewords may be generated so that each page participates in an erasure codeword that is distinct from the erasure codewords of the other pages of the same word line. To illustrate, an exclusive-OR (XOR) operation may be performed on all pages of an erasure codeword to generate erasure parity (also referred to as "erasure recovery data") for the codeword. If a particular word line fails, each of the 12 pages of the failed word line may be recovered based on performing a XOR operation ("XORing") on the non-failed pages and the erasure parity of the respective erasure codewords. The erasure parity for each erasure codeword may be generated and maintained in volatile memory, such as controller static random access memory (SRAM), updated as each page of data is sent to the non-volatile memory for storage, and stored to the non-volatile memory after the data has been stored in the non-volatile memory.

Although 12 pages of erasure parity data may be stored in the SRAM to enable erasure recovery in the event a single word line is defective, multiple word lines may be affected by a single defect. For example, a conductive path may form between adjacent word lines, resulting in a word line-to-word line short ("WL-WL short") that can corrupt, or cause programming failure, for 24 pages of data. As another example, when a non-volatile memory includes multiple planes that share hardware components, such as charge pumps, a WL-WL short or other defect in one plane can also cause corruption or programming failure to one or more adjacent word lines in the other plane. Further, some implementations support having multiple "open" blocks to receive programming data; any one or more of the open blocks may be subject to an unexpected data loss due to a word line defect in the block. Thus, protecting data being programmed to a non-volatile memory may use a relatively large number of erasure parity pages. However, increasing a size of controller SRAM to provide erasure parity for each potential data loss may cause the cost of the controller to be prohibitively expensive, and storing the erasure parity to non-volatile memory reduces a storage density of the non-volatile memory.

Figure 8:
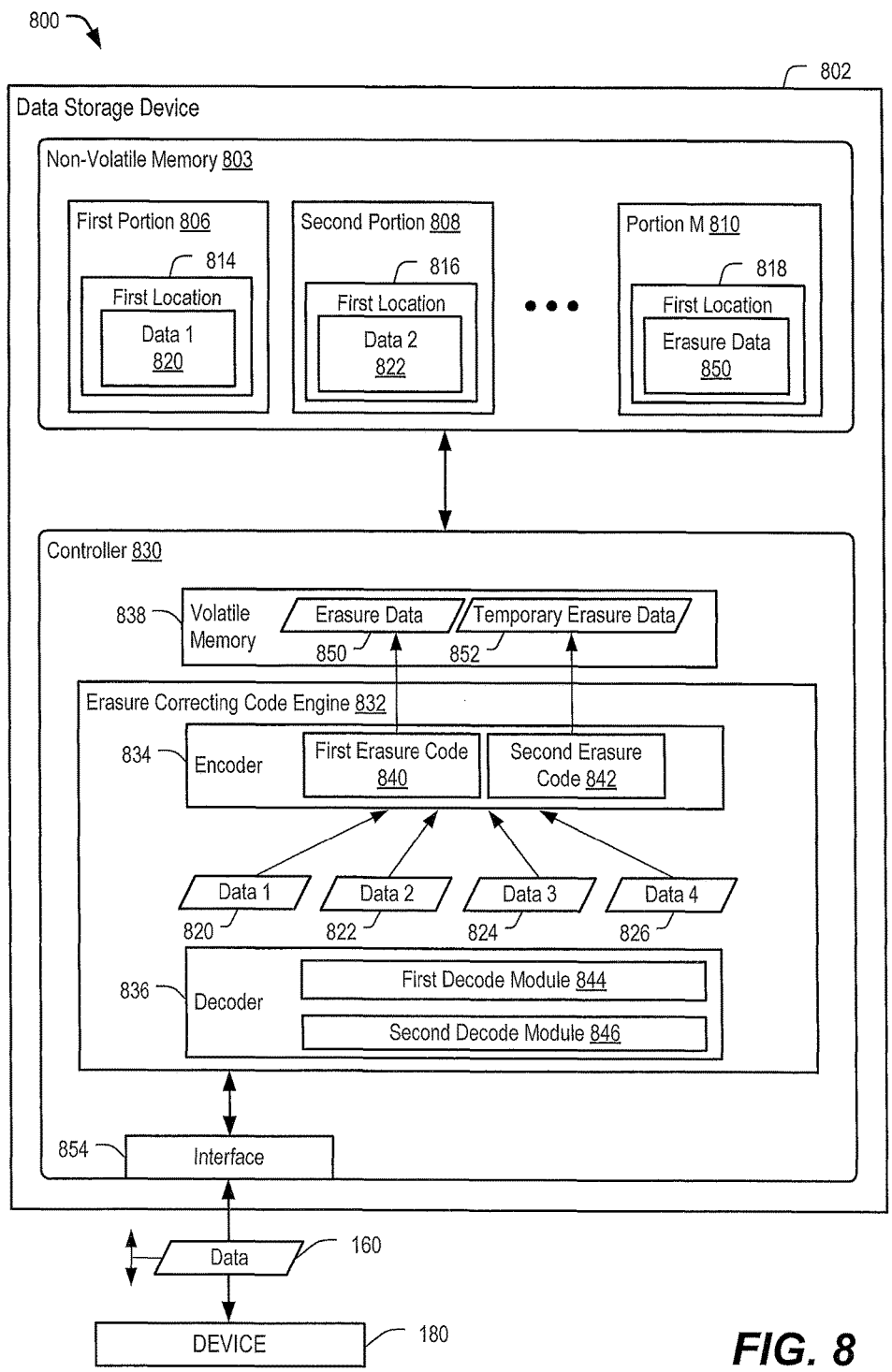
FIG. 8 is a diagram of a particular example of a system including an erasure correcting code engine that is configured to perform erasure correcting coding using temporary erasure recovery data.

FIG. 8 illustrates a system 800 that includes a data storage device 802 coupled to the device 180 of FIG. 1. For example, the data storage device 802 may correspond to the device 102 of FIG. 1. The data storage device 802 includes a non-volatile memory 803 coupled to a controller 830. The controller 830 is coupled to the device 180 via an interface 854. For example, the interface 854 may correspond to the interface 154 of FIG. 1. The controller 830 includes a volatile memory 838 and an erasure correcting code engine 832. The erasure correcting code engine 832 is configured to generate first erasure recovery data ("erasure data") 850 and temporary erasure recovery data ("temporary erasure data") 852 in the volatile memory 838 as part of a write operation that writes data to the non-volatile memory 803. Upon determining that the data is stored in the non-volatile memory 803, the controller 830 is configured to discard the temporary erasure data 852 and to store the erasure data 850 into the non-volatile memory 803. Thus, the controller 830 retains a larger amount of erasure recovery data until a verification is made that the data has been stored in the non-volatile memory 803, after which a smaller amount of the erasure recovery data is kept in the non-volatile memory 803 while the remainder of the erasure recovery data is discarded.

The non-volatile memory 803 includes a first portion 806, a second portion 808, and one or more portions including an Mth portion 810 (where M is an integer greater than 1). For example, each portion 806-810 may correspond to a die, a plane, a block (e.g., an erase block), or one or more other portions of the non-volatile memory 803. The first portion 806 stores first data 820 in a first location 814. For example, the first location 814 may be a first word line (e.g., a word line with index 0 (WL0)) of a first erase block (e.g., an erase block with block index 0 (block 0) of the first portion 806. The second portion 808 includes second data 822 stored at the first location 816 (e.g., at WL0, block 0) of the second portion 808. The Mth portion 810 stores the erasure data 850 at the first location 818 (e.g., at WL0, block 0) of the Mth portion 810).

The volatile memory 838 is configured to store the erasure data 850 (e.g., first erasure recovery data) and the temporary erasure data 852 (e.g., temporary erasure recovery data) to be available for data recovery of data stored to the non-volatile memory 803. After writing of data to the non-volatile memory 803 has completed and the data is verified to have been successfully programmed into the non-volatile memory 803, the volatile memory 838 is configured to provide the erasure data 850 for storage in the non-volatile memory 803 and to discard (e.g., delete or mark as invalid or unused) the temporary erasure data 852.

The erasure correcting code engine 832 is configured to generate the erasure data 850 and the temporary erasure data 852 in the volatile memory 838. The erasure correcting code engine 832 is configured to generate the erasure data 850 and the temporary erasure data 852 at least partially based on the first data 820 to be written to the non-volatile memory 803. The erasure data 850 is configured to enable a first type of data recovery of the first data 820, and the temporary erasure data 852 is configured to enable a second type of data recovery of the first data 820, as described further with reference to the decoder 836.

The erasure correcting code engine 832 includes an encoder 834 and the decoder 836. The encoder 834 is configured to apply a first erasure code 840 to data to be stored to the non-volatile memory 803. For example, the controller 830 may receive the first data 820, the second data 822, third data 824, and fourth data 826. The controller 830 may provide the received data 820-826 to the error correcting code engine 832 to be encoded by the encoder 834. The encoder 834 may apply an encoding using the first erasure code 840 to generate the erasure data 850. For example, the first erasure code 840 may correspond to a XOR operation of the first data 820 with the second data 822. To illustrate, the encoder 834 may apply the first erasure code 840 according to Equation 3.

erasure data 850=first data 820⊕second data 822⊕. . . ⊕data M  (Equation 3)

In Equation 3, the "⊕" symbol represents a bitwise XOR operation, M is an integer greater than one, the erasure data 850 is an erasure parity portion of the erasure correcting codeword, and the first data 820, the second data 822, and other data including the Mth data form a data portion of an erasure correcting codeword. In an illustrative example, the erasure data 850 is the parity symbol $p_0$ of FIGS. 1-5 and Equation 1.

The encoder 834 is also configured to apply a second encoding using a second erasure code 842 to generate the temporary erasure data 852. For example, in a particular implementation the second erasure code 842 corresponds to a XOR operation of a different set of data than is encoded using the first erasure code 840. To illustrate, the temporary erasure data 852 may correspond to an erasure parity in accordance with Equation 4.

temporary erasure data 852=first data 820⊕data M+1⊕. . . ⊕data PM+1  (Equation 4)

In Equation 4, P is an integer greater than 1. The first erasure code 840 may be used to generate "horizontal" parity (e.g., encoding data in a common location (e.g., at WL0, block 0) of each of the portions 806-810), and the second erasure code 842 may be used to generate "vertical" parity (e.g., encoding data at different locations within a common portion of the non-volatile memory 803 (e.g., at WL0, WL1, WL2 WL X (where X is an integer greater than 1)) of one or more blocks in the first portion 806). An illustrative example of the temporary erasure data 852 corresponding to vertical parity (for alternating word lines) is described in further detail with reference to FIG. 11 and FIG. 12.

In another implementation, the second erasure code 842 may correspond to a Reed-Solomon code, and the encoder 834 generates the temporary parity data 852 as the parity symbol $p_1$ described with reference to FIGS. 1-5 and Equation 1. The parity data 850 and the temporary parity data 852 may be used to provide erasure protection for two or more erasures per row (e.g., to enable recovery from failures at two or more of the portions 806-808), such as in a RAID-6-type implementation. Illustrative examples are described in further detail with reference to FIG. 9 and FIG. 10.

The decoder 836 includes a first decode module 844 and a second decode module 846. The first decode module 844 is configured to utilize the first type of data recovery enabled by the erasure data 850 to recover lost data, providing the first decode module 844 with a first capability to re-generate the first data 820 in case the first data 820 is corrupted during programming to the nonvolatile memory 803 or while stored at the non-volatile memory 803. For example, the first decode module 844 may be configured to decode an erasure codeword that is based on the first erasure code 840 to recover data corresponding to an erasure. To illustrate, when the erasure data 850 is generated according to Equation 3, the erasure data 850 enables the first decode module 844 to recover the first data 820 via the first type of data recovery (e.g., recovering an erased portion of an erasure codeword by XORing the parity data of the erasure codeword with the non-erased data portions of the erasure codeword) described by Equation 5.

$$\text{first data } 820 = \text{erasure data } 850 \oplus \text{second data } 822 \oplus \ldots \oplus \text{data } M \quad \text{(Equation 5)}$$

Thus, the erasure data 850 enables the first decode module 844 to use the first type of data recovery to recover the first data 820 by XORing the erasure data 850 with the second data 822 and the remaining portions of the erasure codeword used to generate the erasure data 850.

The second decode module 846 is configured to utilize the second type of data recovery enabled by the temporary erasure data 852 to recover lost data, providing the second decode module 846 with a second capability to re-generate the first data 820 in case the first data 820 is corrupted during programming to the nonvolatile memory 803 or while stored at the non-volatile memory 803. For example, the second decode module 846 may be configured to decode an erasure codeword that is based on the second erasure code 842 to recover data corresponding to an erasure. To illustrate, when the temporary erasure data 852 is generated according to Equation 4, the temporary erasure data 850 enables the second decode module 846 to recover the first data 820 via the operation described by Equation 6.

$$\text{first data } 820 = \text{temporary erasure data } 852 \oplus \text{data } M+1 \oplus \ldots \oplus \text{data } PM+1 \quad \text{(Equation 6)}$$

In the example illustrated in Equation 6, the second type of data recovery corresponds to a XOR operation that enables the second decode module 846 to recover the first data 820 by XORing the temporary erasure data 852 with the $(M+1)^{st}$ data and the remaining portions of the erasure codeword used to generate the temporary erasure data 852. As another example, in an implementation in which the temporary erasure data 852 corresponds to Reed-Solomon parity, the second decode module 846 is configured to recover the first data 820 via a second type of data recovery that corresponds to one or more of the techniques described with reference to FIGS. 1-7.

During operation, the data storage device 802 may receive data from the device 180, such as the data 160 that includes the data portions 820-826. The erasure correcting code engine 832 may generate the erasure data 850 based on processing the data portions 820-826 using the first erasure code 840 and may generate the temporary erasure data 852 by processing the data portions 820-826 using the second erasure code 842. The controller 830 may send the data portions 820-826 to be stored to the non-volatile memory 803, such as by storing the first data 820 to the first location 814 of the first portion 806, the second data 822 to the first location 816 of the second portion 808, and by storing the third data 824 and the fourth data 826 into other portions of the non-volatile memory 803 (such as depicted in further detail with reference to FIGS. 9-11).

After writing the data 820-826 to the non-volatile memory 803, the controller 830 may perform a write verify operation to verify that the data is correctly written to the non-volatile memory 803. For example, after performing each data write operation, the controller 830 may perform an enhanced post-write read (EPWR) operation that includes reading the data from the non-volatile memory 803 and determining an error metric, such as an actual or estimated count of errors or error rate of the data (e.g., by determining a syndrome weight of the data). Alternatively, the non-volatile memory 803 may include data verification circuitry configured to read the data and generate the error metric. After determining that the error metric satisfies (e.g., does not exceed) an error threshold, the data may be verified as correctly programmed into the non-volatile memory 803.

After verifying that the first data 820 is stored in the non-volatile memory 803, the controller 830 is configured to discard or modify the temporary erasure data 852 to remove the second capability of the second decode module 846 to use the second type of data recovery to regenerate the first data 820. In an illustrative example in which the temporary erasure parity 852 provides the second capability to regenerate the first data 820 and also provides a capability to regenerate other data that has not yet been verified to be correctly stored in the non-volatile memory 803, the controller 830 may modify the temporary erasure parity 852 (e.g., "de-XOR" the first data 820, as described in further detail with reference to FIGS. 11-12) to remove the second capacity to regenerate the first data 820 while maintaining the capacity to regenerate the other data. In another illustrative example in which all the data that contributes to the temporary erasure parity 852 has been verified to be correctly stored in the non-volatile memory 803, the controller 830 may discard the temporary erasure parity 852.

By generating and storing the temporary erasure data 852 until a successful data write operation is verified, the additional erasure correction capacity provided by the temporary erasure data 852 remains usable by the controller 830 for regeneration of the data in case the write operation is determined to be unsuccessful. After verifying that the data is correctly stored in the non-volatile memory 803, the controller 830 may discard the temporary erasure data 852 to conserve storage capacity of the volatile memory 838 or may modify the temporary erasure data 852 to reduce the complexity of erasure recovery for other data, as described in further detail with reference to FIGS. 11-12.

Although examples of data recovery are presented with reference to the first data 820, it should be understood that data recovery may be performed to recover any of the data symbols within the data portion of an erasure codeword. Although examples are described in which the erasure data 850 includes a parity portion of a first erasure codeword and the temporary erasure data 852 includes a parity portion of a second erasure codeword, in other implementations the erasure data 850 includes parity for multiple erasure encodings (e.g., parity $p_0$ and $p_1$, as an illustrative example), the temporary erasure data 852 includes parity for multiple erasure encodings (e.g., parity $p_0$ and $p_1$, as an illustrative example), or a combination thereof.

Figure 9:
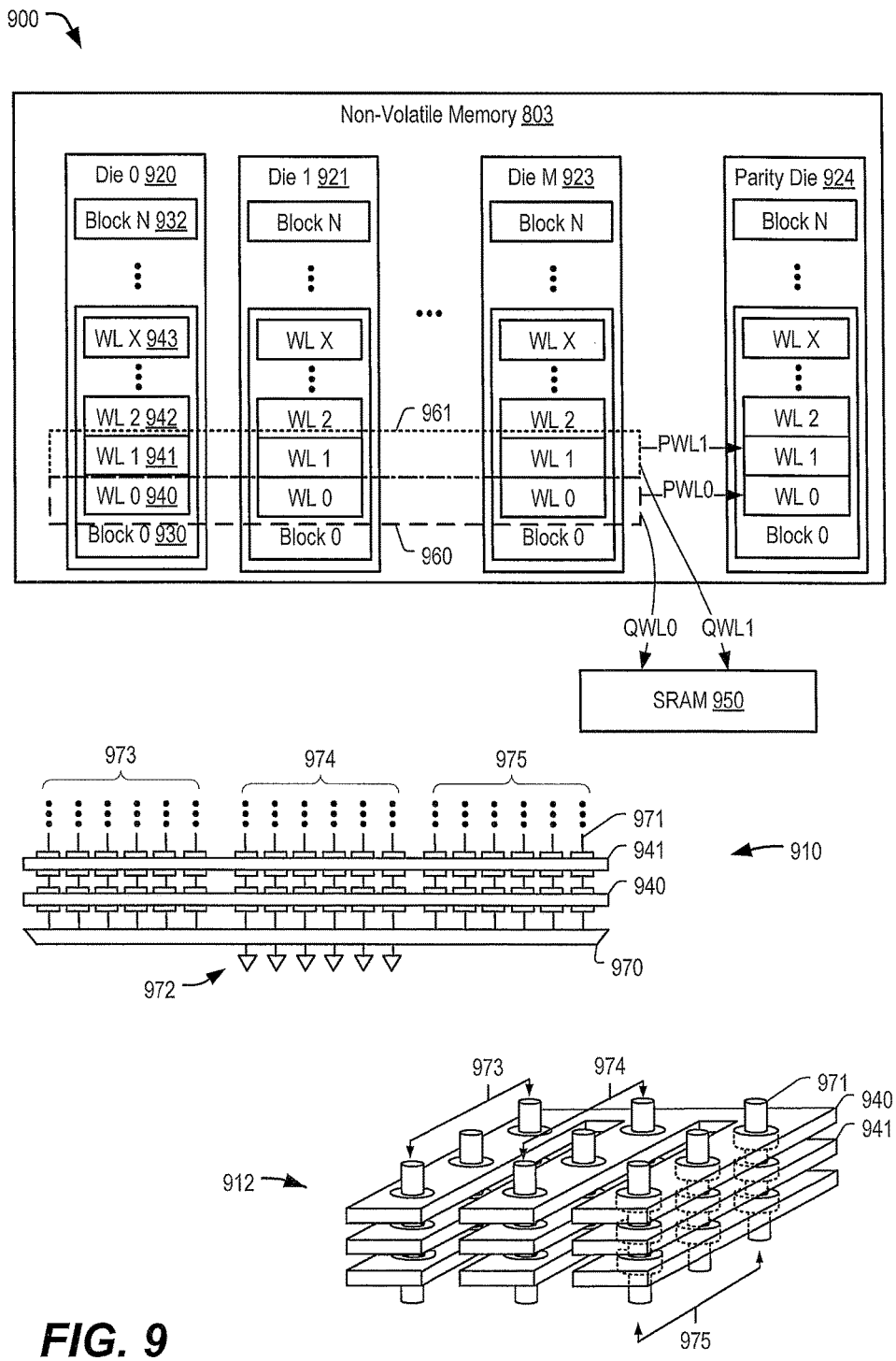
FIG. 9 is a diagram illustrating a first example of components that may be implemented in the data storage device of FIG. 8 in conjunction with a first horizontal erasure parity scheme.

FIG. 9 depicts an example 900 of components that are included in the data storage device 802 of FIG. 8 according to a particular implementation. In the example 900, the non-volatile memory 803 includes multiple flash memory dies, illustrated as die 0 920, die 1 921, and one or more other flash memory dies, including die M 923 and a parity die 924. Each die 920-924 includes multiple erase blocks, such as a representative block 0 930 and block N 932 of die 0 920 (N is a positive integer). Each of the blocks includes one or more word lines, illustrated as representative word lines WL0 940, WL1 941, WL2 942, and one or more word lines including WLX 943 (X is a positive integer), of block 0 930 of die 0 920. Each of the word lines WL0-WLX of each block of each of the dies 920-924 is configured to store one or more units of data.

Data to be written to the non-volatile memory 803 is distributed among multiple dies. For example, the first data 820 may be stored in WL0 940 of block 0 930 of die 0 920, the second data 822 may be stored in WL0 of block 0 of die 1 921, the third data 824 may be stored in WL0 of block 0 of another die, and the fourth data 826 may be stored in WL0 of block 0 of die M 923.

The example 900 illustrates a multi-die horizontal parity scheme. For example, a first data group 960 may be a logical group of data at WL0 of block 0 of each of the dies 920-923. Erasure recovery data may be formed based on the data group 960, such as via application of the first erasure code 840 (e.g., by performing a XOR operation of the data portions within the data group 960 that are stored in each of the dies). The resulting erasure recovery data, corresponding to the first erasure recovery data 850 of FIG. 1, is depicted in FIG. 9 as parity for WL0 of block 0 (PWL0) and is stored to a corresponding portion of the parity die 924 (e.g., in WL0 of block 0 of the parity die 924). In a particular implementation, PWL0 corresponds to the parity symbol $P_0$ of the codeword 210 of FIG. 2.

Figure 10:
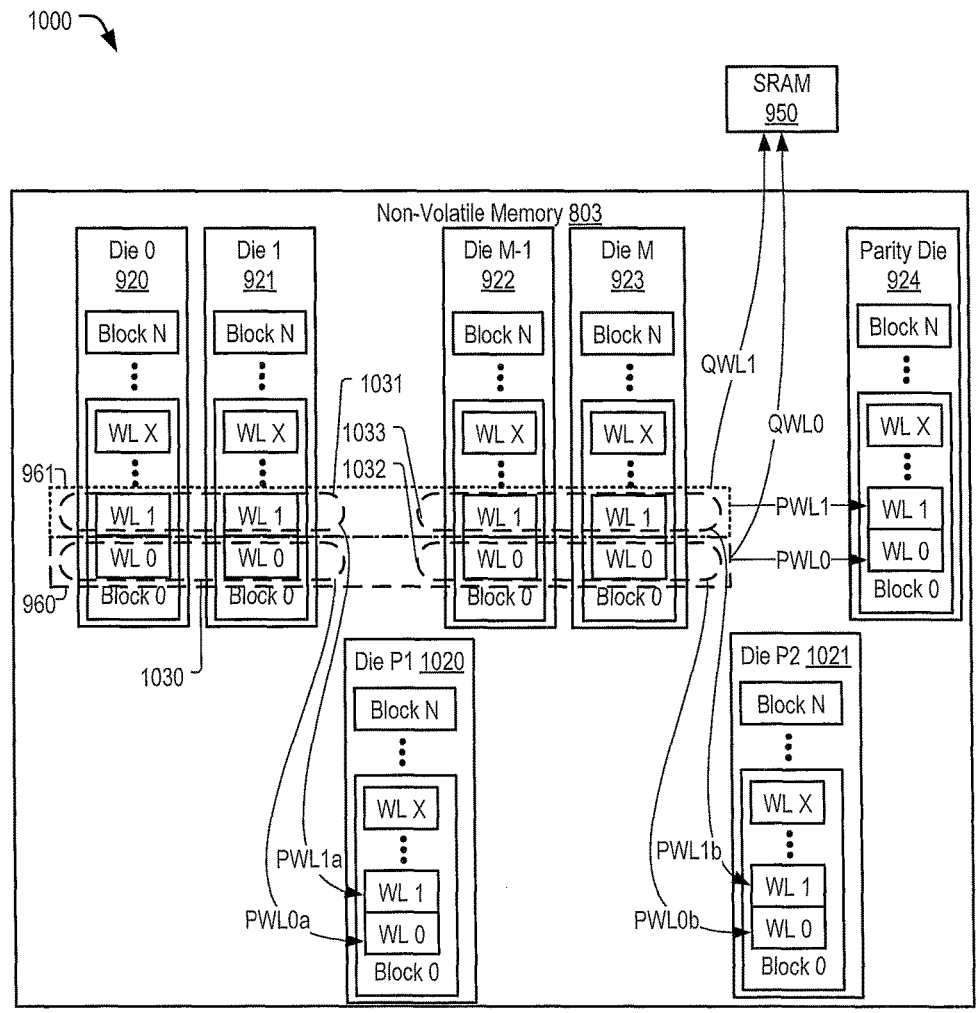
FIG. 10 is a diagram illustrating a second example of components that may be implemented in the data storage device of FIG. 8 in conjunction with a second horizontal erasure parity scheme that uses partial parity.
Figure 11:
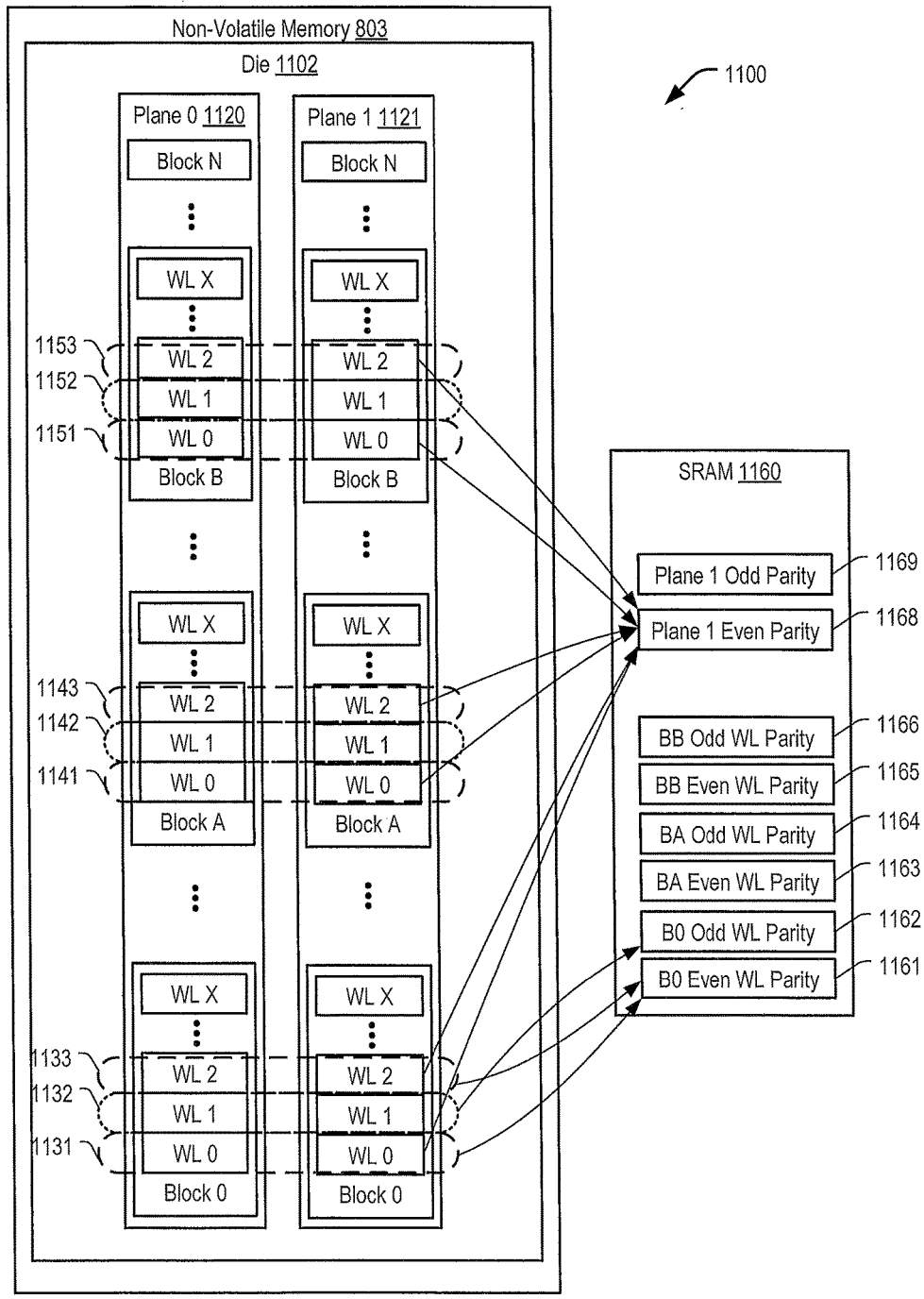
FIG. 11 is a diagram illustrating a third example of components that may be implemented in the data storage device of FIG. 8 in conjunction with a vertical erasure parity scheme.

In addition to generating PWL0 corresponding to the first erasure recovery data 850 for the first data group 960, a second parity QWL0 is generated for the first data group 960. QWL0 corresponds to the temporary erasure data 852 of FIG. 1 and is stored in an SRAM 950 that corresponds to the volatile memory 868 of FIG. 8. For example, QWL0 may correspond to Reed-Solomon erasure parity of the first data group 960, such as the parity symbol $P_1$ of the codeword 210 of FIG. 2. (Although FIGS. 9-11 depict storage of temporary erasure data in SRAM, in other implementations the temporary erasure data may be stored in one or more other types of volatile memory (e.g., DRAM).)

A second data group 961 is illustrated as including data at WL1 of block 0 of each of the dies 920-923. Data portions of the second data group 961 are encoded by the first erasure code 840 to generate erasure data PWL1. The data portions of the second data group 961 are also encoded by the second erasure code 842 to generate temporary erasure data QWL1. The temporary erasure data QWL0 and QWL1 are stored in the SRAM 950 until writing of the data of the first data group 960 and the second data group 961, respectively, into the non-volatile memory 803 has been verified. For example, because word line-to-word line short conditions may occur between WL0 and WL1 in any of the dies 920-924, the temporary erasure data QWL0 corresponding to the first data group 960 may be stored in the SRAM 950 until after the data written in WL0 of the dies 920-923 have been verified, and also until after the data of the second data group 961 has been written to WL1 of the dies 920-924 and verified. After verifying that data stored a particular word line of the non-volatile memory 803 is correctly written and also that data stored on adjacent word line(s) to the particular word line is also correctly written, the temporary erasure correction data (e.g. QWL0, QWL1) corresponding to the data group may be removed from the SRAM 950 or marked as available for replacement by other data.

Because WL-WL shorts are more likely to occur between adjacent word lines than between non-adjacent word lines, the SRAM 950 may store temporary erasure data for two word lines at a time. For example, the SRAM 950 may store QWL0 as the data of the first data group 960 is written to WL0 of block 0 of the dies 920-923. After verifying data storage of the first data group 960 (e.g., using EPWR), QWL0 may remain in the SRAM 950 while data of the second data group 961 is written to WL1 of block 0 of the dies 920-924. After QWL1 is generated in the SRAM 950 and after verifying data storage of second data group 961 (and verifying that programming of the second data group 961 did not disturb the first data group 960), QWL0 may be deleted from the SRAM 950, and other temporary erasure data (e.g., QWL2) may be stored into the SRAM 950 while data is written to WL2 of block 0 of the dies 920-923. After verifying storage of the data written to WL1 and WL2, QWL1 may be deleted from the SRAM 950 and temporary erasure data (e.g., QWL3) for a next word line to be programmed may be stored into the SRAM 950 Thus, in some implementations, the SRAM 950 stores temporary erasure data for two word lines at a time (e.g., an even-numbered word line and an adjacent odd-numbered word line). In other implementations, the SRAM 950 store temporary erasure data for more than two word lines at a time to provide additional erasure recovery capability.

In some implementations, the data stored into each word line is logically or physically partitioned into pages. For example, in an MLC implementation with three physical pages per word line, each word line of a die is configured to store six pages of data (e.g., six error correcting code (ECC) codewords). The erasure data 850 (e.g., PWL0) and the temporary erasure data 852 (e.g., QWL0) may also each include six pages of erasure parity data. To illustrate, a first data page of WL0 of each die 920-923 may be encoded to generate a first erasure data page of PWL0 and a first temporary erasure data page of QWL0, a second data page of WL0 of each die 920-923 may be encoded to generate a second erasure data page of PWL0 and a second temporary erasure data page of QWL0, etc. As another example, in a TLC implementation with four physical pages per word line, each word line of a die is configured to store twelve pages of data, and the erasure data 850 (e.g., PWL0) and the temporary erasure data 852 (e.g., QWL0) may each include twelve pages of erasure parity data.

Physical page partitions of word lines are illustrated in a simplified planar (e.g., two-dimensional or 2D) architecture example 910 and in a simplified three-dimensional (3D) architecture example 912. In the planar architecture example 910, storage elements (e.g., floating-gate transistor flash memory cells) are coupled to the word lines 940, 941 and to bit lines, such as a representative bit line 971. The storage elements are partitioned based on whether each storage element is coupled to a bit line of a first group of bit lines 973, a second group of bit lines 974, or a third group of bit lines 975. Selection circuitry 970 (e.g., a multiplexor) selectively couples the bit lines of a selected group of bit lines to sense amplifiers 972 and decouples the non-selected groups of bit lines from the sense amplifiers 972, enabling reading of the storage elements coupled to a selected word line and to the selected group of bit lines.

WL0 940 is coupled to a first "physical page" of storage elements that are coupled to the first group of bit lines 973, a second physical page of storage elements that are coupled to the second group of bit lines 974, and a third physical page of storage elements that are coupled to the third group of bit lines 975. In a TLC implementation, the first physical page of WL0 940 stores three logical pages of data, the second physical page of WL0 940 stores three logical pages of data, and the third physical page of WL0 940 stores three logical pages of data, totaling nine logical pages of data stored at WL0 940. The first data group 960 may include nine sub-groups, with each sub-group corresponding to a respective logical page. Similarly, WL1 941 is coupled to three physical pages that collectively store nine logical pages of data at WL1 941, and the second data group 961 may include nine sub-groups.

In the 3D architecture example 912, storage elements (e.g., charge trap flash memory cells) are coupled to the word lines 940, 941 and to bit lines including the representative bit line 971. In contrast to the planar architecture example 910 in which the bit lines and word lines correspond to columns and rows of an array along a die surface, in the 3D architecture 912 the word lines correspond to conductive layers that are substantially parallel to the die surface and that are intersected by vertical bit lines. Although referred to as word "lines", the word lines may have a shape other than a line, such as the multi-pronged structure of the illustrative, non-limiting example depicted in FIG. 9.

The storage elements are partitioned based on whether each storage element is coupled to a bit line of the first group of bit lines 973, the second group of bit lines 974, or the third group of bit lines 975. WL0 940 is coupled to a first physical page or "string" of storage elements that are coupled to the first group of bit lines 973, a second string of storage elements that are coupled to the second group of bit lines 974, and a third string of storage elements that are coupled to the third group of bit lines 975. In a TLC implementation, the first string of WL0 940 stores three logical pages of data, the second string of WL0 940 stores three logical pages of data, and the third string of WL0 940 stores three logical pages of data, totaling nine logical pages of data stored at WL0 940. Similarly, WL1 941 has three strings that collectively store nine logical pages of data at WL1 941.

Although the simplified examples 910, 912 depict three physical pages or strings per word line, in other implementations each word line may have one, two, or more than three physical pages or strings. Although the planar architecture example 910 depicts six storage elements per physical page and the 3D architecture example 912 depicts, three storage elements per string for clarity of illustration, in other implementations each physical page or string may have any number of storage elements. In some examples, each physical page or string includes several hundred storage elements, several thousand storage elements, or any other number of storage elements.

FIG. 10 depicts an example 1000 that corresponds to the example 900 of FIG. 9 with partial erasure parity. The non-volatile memory 803 includes the dies 920-924 and also includes a die P1 1020 and a die P2 1021. The die P1 1020 and the die P2 1021 are configured to store partial parity erasure recovery data. For example, the first data group 960 may include multiple subsets, such as a first subset 1030 and a second subset 1032. The first subset 1030 is encoded to generate partial parity PWL0a that is stored in die P1 1020, and the second subset 1032 is encoded to generate partial parity PWL0b that is stored in die P2 1021. The second data group 961 may include multiple subsets including a first subset 1031 that is encoded to generate partial parity PWL1a that is stored in die P1 1020 and a second subset 1033 that is encoded to generate partial parity PWL1b that is stored in die P2 1021.

In an illustrative example, the first subset 1030 corresponds to the first subset 222, the second subset 1032 corresponds to the second subset 224, the partial parity PWL0a corresponds to the parity symbol $P_{0,0}$, and the partial parity PWL0b corresponds to the parity symbol $P_{0,1}$ of the codeword 220 of FIG. 2. The erasure data PWL0 corresponds to the parity symbol $P_1$ of the codeword 220 of FIG. 2, and the temporary erasure data QWL0 corresponds to the parity symbol $P_2$ of the codeword 220 of FIG. 2. In other illustrative examples, the data groups 960, 961 may be logically partitioned and encoded in accordance with any of the codewords 230-260 of FIG. 2.

Although FIG. 10 depicts storage of partial parity in die P1 1020 and die P2 1021 in the non-volatile memory 803, in other implementations partial parity may be stored as temporary erasure data in the SRAM 950. For example, the temporary erasure data 850 (e.g., QWL0) may include one or more partial parity symbols. By generating partial parity, recovery of data may be performed more quickly due to locality of the partial parity as compared to implementations that do not generate partial parity.

FIG. 11 depicts an example 1100 of an implementation that includes a horizontal erasure parity scheme across multiple planes of a die 1102 of the non-volatile memory 803 and a vertical erasure parity scheme that excludes at least one plane of the multiple planes. An SRAM 1160 corresponds to the volatile memory 838 of FIG. 8 and stores temporary parity data. A first plane (plane 0) 1120 of the die 1102 includes multiple blocks, including block 0, block A, block B, and block N (A, B, and N are positive integers). A second plane (plane 1) 1121 of the die 1102 has similar structures as the first plane 1120 and includes multiple blocks, including block 0, block A, block B, and block N.

As illustrated in FIG. 11, blocks 0, A, and B of the planes 1120, 1121 are "open" blocks, and the other blocks of the planes 1120-1121 are "closed" blocks. An "open" block is a block into which at least some data can be or has been written, and the block has not yet been closed to additional data writes. A "closed" block is not available for data writes, such as a block into which data has been written and conditioned for non-volatile storage.

Multiple data groups are used in the horizontal parity scheme, including a first data group 1131, a second data group 1132, and a third data group 1133 corresponding to block 0, a fourth data group 1141, a fifth data group 1142, and a sixth data group 1143 corresponding to block A, and a seventh data group 1151, an eighth data group 1152, and a ninth data group 1153 corresponding to block B. For example, the first data group 1131 corresponds to data stored in WL0 of block 0 of plane 0 1120 and data stored in WL0 of block 0 of plane 1 1121. The first erasure code 840 may be applied to the data in the first data group 1131 and the third data group 1133 to generate parity data for alternating word lines for block 0 to be stored in the SRAM 1160.

Because a WL-WL short may result in a data loss during writes to neighboring word lines, even word lines and odd word lines may be separately encoded by the first erasure code 840 to provide a 2-word line capability for data recovery. For example, the first parity 1161 may correspond to erasure data 850 for word lines of block 0 with even-numbered indices, such as WL0, WL2, etc. (also referred to as "even parity" for "even WLs"), and second parity 1162 may correspond to erasure data 850 for word lines of block 0 having odd-numbered indices, such as WL1, WL3, etc. (also referred to as "odd parity" for "odd WLs"). Thus, data groups 1131 and 1133 participate in generating the first parity 1161. Data group 1132 participates in generation of the second parity 1162 and is excluded from or independent of the first parity 1161.

As illustrated, the SRAM 1160 also includes even WL parity 1163 and odd WL parity 1164 for block A and includes even WL parity 1165 and odd WL parity 1166 for block B. In addition, the SRAM 1160 stores plane 1 even parity 1168 and plane 1 odd parity 1169. The plane 1 even parity 1168 and the plane 1 odd parity 1169 are generated using the second erasure code 842 and correspond to the temporary erasure correction data 852. The plane 1 even parity 1168 corresponds to the XOR of each of the word lines with even-numbered indices that store data in each of the open blocks of plane 1 1121 (and excludes data from plane 0 1120). For example, WL0 and WL2 from block 0, WL0 and WL2 from block A, and WL0 and WL2 from block B (in addition to all other data in even WLs in blocks 0, A, and B) may be encoded by the second erasure code 842 to generate the plane 1 even parity 1168. Similarly, data from open blocks stored at word lines having odd-numbered indices may be encoded using the second erasure code 842 to generate the plane 1 odd parity 1169. For example, data stored at WL1 of block 0, WL1 of block A, and WL1 of block B (in addition to all other data in odd WLs in blocks 0, A, and B) may be encoded according to the second erasure code 842 to generate the plane 1 odd parity 1169.

The parity 1161-1166 may be maintained as "running totals" in which additional data is XORed with the corresponding existing parity 1161-1166 to update the parity to protect the additional data as the additional data is written to any of the open blocks. The additional data that is stored to plane 1 1121 is also XORed with the plane 1 even parity 1168 or plane 1 odd parity 1169. After final data for a block is written to an open block and the data is verified (e.g., via EPWR), the corresponding parities 1161-1166 for the block may also be written into the block and verified, and the block may be closed.

If data storage has failed at a word line of plane 0, at a word line of plane 1, or at a pair of adjacent word lines of plane 0 or plane 1, the corresponding parity (or parities) 1161-1166 is used, along with the other correctly stored data that participates in the erasure codeword, to regenerate the failed data. However, if data storage has failed at the same word line of plane 0 and plane 1 (e.g., due to voltage shifts resulting from a WL defect in one plane propagating to the other plane via a common charge pump that provides charge to both planes 1120, 1121), the parities 1161-1166 are insufficient to regenerate the failed data. In such cases, the plane 1 even parity 1168, the plane 1 odd parity 1169, or a combination thereof, is used to regenerate the failed data in plane 1. After the failed data in plane 1 has been regenerated, the failed data in plane 0 is regenerated using the corresponding one or more of the parities 1161-1166.

The example 1100 thus corresponds to a scheme to handle potential defects that affect multiple planes of a die. The temporary erasure data 1168-1169 is not limited to a single open block and may be shared by multiple open blocks to reduce the storage footprint of the temporary erasure data 1168-1169 in the SRAM 1160. When a block is closed, the data of the closed block is de-XORed from the temporary erasure data 1168-1169, and the corresponding erasure data 1161-1166 for the closed block is stored in the non-volatile memory 803.

Although the example 1100 is described with reference to a single die 1102, in other implementations multiple dies, each including multiple planes, are included in the non-volatile memory 803. The block-level parities 1161-1166 may be separately generated for each die or may span multiple dies (e.g., as described with reference to FIGS. 9-10). The temporary parity data 1168-1169 may be separately generated for each die or may span multiple dies.

Although the example 1100 depicts generating the temporary erasure data 1168-1169 for open blocks of plane 1 1121 but not for open blocks of plane 0 1120, in other implementations the temporary erasure data 1168-1169 is generated for open blocks of plane 0 but not for open blocks of plane 1. Alternatively, one set of the temporary erasure data 1168-1169 can be generated for plane 0 1120 and another set of temporary erasure data 1168-1169 can be generated for plane 1 1121, for multiple open blocks. In some such implementations, the block-level erasure data 1161-1166 may not be generated or, if generated, may not be stored in the non-volatile memory 803, further reducing an amount of space used in the SRAM 1160.

Figure 12:
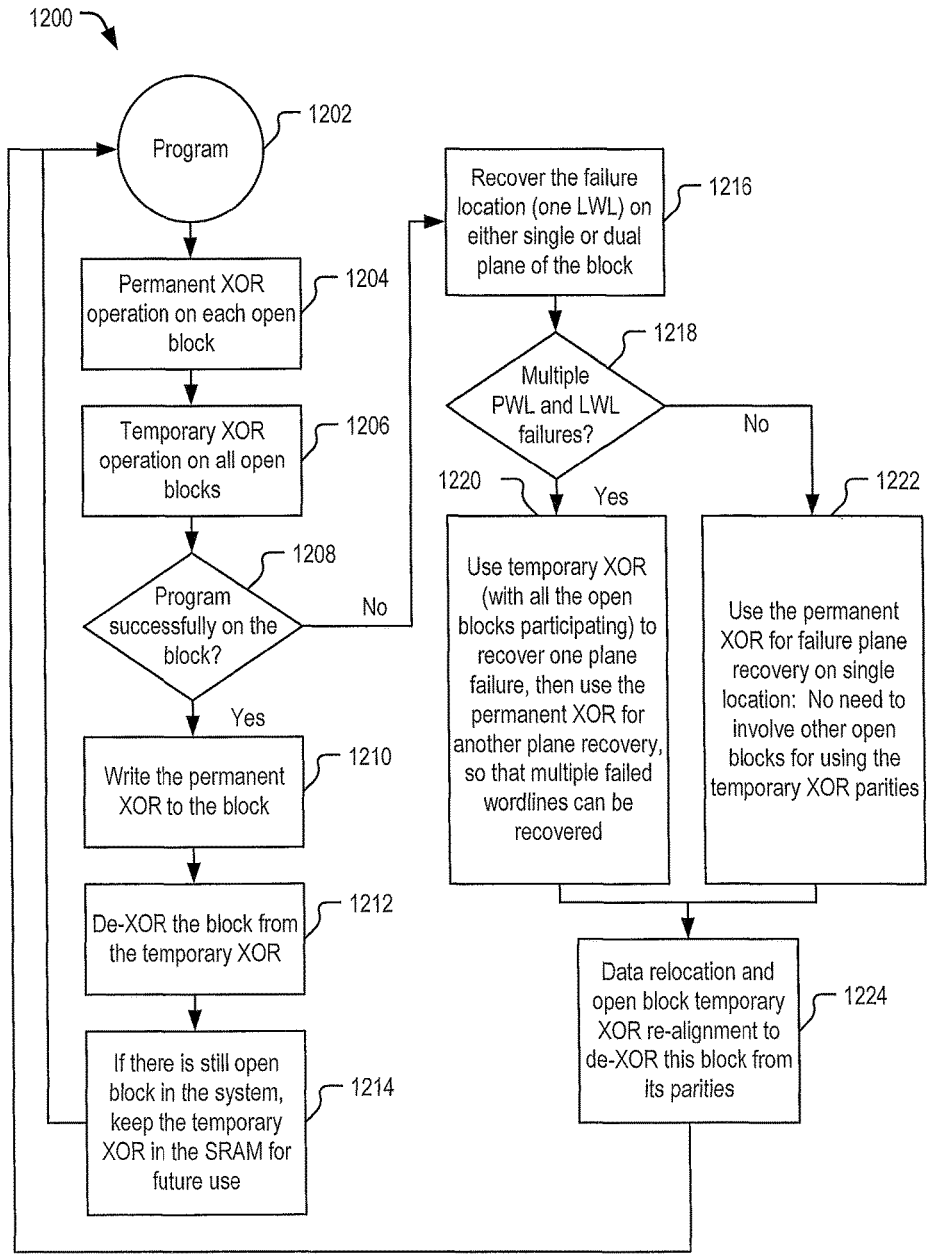
FIG. 12 is a flow chart of an illustrative example of a method of operation that may be performed by the data storage device of FIG. 8.

FIG. 12 depicts an example of a method 1200 that may be performed by the data storage device 802 configured in accordance with the example 1100 of FIG. 11. The method 1200 includes programming data to an open block of the non-volatile memory, at 1202. A "permanent" XOR operation is performed on each open block, at 1204. For example, the "permanent" XOR operation may correspond to encoding using the first erasure code 840 to generate the erasure data 850 (e.g., one or more of the parities 1161-1166) that is to be stored in the non-volatile memory 803.

A "temporary" XOR operation is performed on all open blocks, at 1206. For example, the "temporary" XOR operation may correspond to encoding using the second erasure code 842 to generate the temporary erasure correction data 852 (e.g., one or more of the parities 1168-1169). To illustrate, the permanent XOR operation may generate the even and odd parity data 1161-1166 of FIG. 11, and the temporary XOR operation may generate the plane 1 even parity 1168 and the plane 1 odd parity 1169 of FIG. 11.

A determination is made as to whether the program operation was successfully performed on the open block, at 1208. In response to determining that the program operation was successfully completed, the permanent XOR is written to the block, at 1210. For example, when the program operation completes writing of data to block 0, the block 0 even WL0 parity 1161 and the block 0 odd WL parity 1162 may be stored into a specified word line, such as WLX, of block 0, and block 0 may be closed to further writing. In addition, contributions of the data in block 0 to the temporary parity data 1168-1169 may be removed from the temporary parity data 1168-1169, at 1212. For example, after closing block 0, contributions of data from even WLs of block 0 to the plane 1 even parity 1168 may be removed from the plane 1 even parity 1168 via a de-XOR operation that includes XORing the data from the even WLs of block 0 of plane 1 1121 with the plane 1 even parity 1168. If there is still an open block in the system, the temporary parity data 1168-1169 is kept in the SRAM 1160 for future use, at 1214.

In response to determining that the program operation was not successful, at 1208, an operation to recover the failure location on either a single plane or on dual planes of the block is performed, at 1216. A determination is made whether multiple physical page (PWL) and logical page (LWL) failures occur, at 1218. In response to multiple PWL and LWL failures occurring, then the temporary parity data 1168-1169 is used to recover one plane failure (e.g., to recover plane 1 data from a pair of failed word lines), then use the erasure data 1161-1166 for another plane recovery (e.g., to recover plane 0 data from the pair of failed word lines), so that multiple failed word lines can be recovered, at 1220.

In response to only a single PWL and LWL failure, then the erasure data 1161-1166 is used for failure plane recovery on a single location with no need to involve other open blocks for using the temporary erasure data (e.g., the temporary parity data 1168-1169), at 1222. After recovering the erased data resulting from a write failure, data relocation and open block temporary XOR realignment is performed to de-XOR this block from its parities (e.g., the temporary parity data 1168-1169), at 1224.

Figure 13:
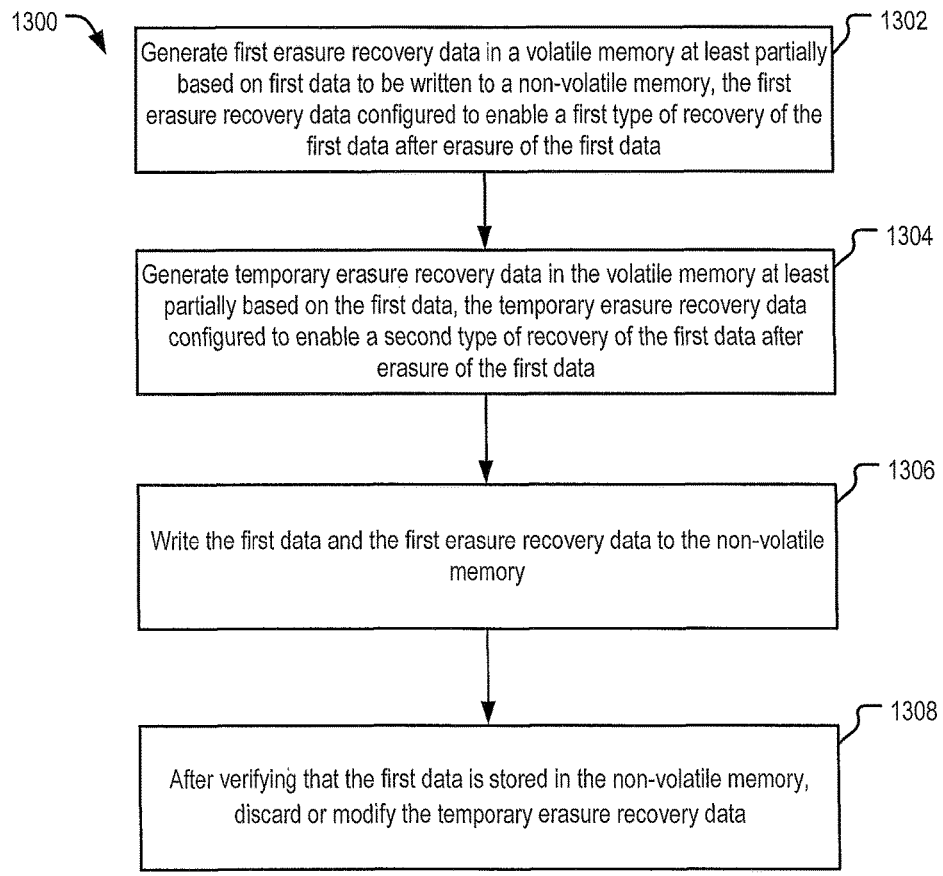
FIG. 13 is a flow chart of another example of a method of operation that may be performed by the data storage device of FIG. 8.

Referring to FIG. 13, a particular illustrative example of a method is depicted and generally designated 1300. The method 1300 may be performed at a data storage device that includes a non-volatile memory and a volatile memory, such as at the data storage device 802 of FIG. 8.

The method 1300 includes generating first erasure recovery data in the volatile memory at least partially based on first data to be written to the non-volatile memory, at 1302. The first erasure recovery data is configured to enable a first type of recovery of the first data after erasure of the first data. For example, the first erasure recovery data may correspond to the erasure data 850 of FIG. 8.

The method 1300 includes generating temporary erasure recovery data in the volatile memory at least partially based on the first data, at 1304. The temporary erasure recovery data is stored in the volatile memory and configured to enable a second type of recovery of the first data after erasure of the first data. For example, the temporary erasure recovery data may correspond to the temporary erasure data 852 of FIG. 8.

The method 1300 includes writing the first data and the first erasure recovery data to the non-volatile memory, at 1306. For example, the first data may correspond to the first data 820 and the erasure data 850 that are provided by the controller 830 to be written into the non-volatile memory 803.

The method 1300 includes, after verifying that the first data is stored in the non-volatile memory, discarding or modifying the temporary erasure recovery data, at 1308. For example, the controller 830 of FIG. 8 may discard (e.g., erase, overwrite, or invalidate) the temporary erasure data 852 of the volatile memory 838 after verifying the first data is stored in the non-volatile memory 803, such as after a successful enhanced post-write read (EPWR) operation. As another example, the erasure correcting code engine 832 may modify the temporary erasure data 852 of the volatile memory 838 to remove the contribution of the first data from the temporary erasure data 852, such as by performing a XOR operation of the first data 820 with the temporary erasure data 852.

In some implementations, the first data corresponds to a logical page of data to be written to a first page location in a first block location of a first die of the non-volatile memory, such as a logical page of data to be written to WL0 940 of block 0 930 of die 0 920 of FIG. 9 or FIG. 10. The first erasure recovery data is generated further based on second data to be written to the first page location in the first block location of a second die of the non-volatile memory, such as second data to be written to WL0 of block 0 of die 1 921 of FIG. 9 or FIG. 10. In an illustrative example, the first erasure recovery data corresponds to the erasure parity PWL0 that is generated based on the data in the data group 960 of FIG. 9, and the temporary erasure recovery data is also generated further based on the second data (and the other data in the data group 960) and corresponds to the erasure parity QWL0 of FIG. 9. The first erasure recovery data is written to a first parity die (e.g., parity die 924) of the non-volatile memory 803, and the temporary erasure recovery data is stored in a volatile memory (e.g., the SRAM 950).

In another illustrative example with reference to FIG. 10, the first erasure recovery data corresponds to the partial erasure parity PWL0a that is generated based on the data in the subset 1030 of FIG. 10. Second erasure recovery data (e.g., the partial erasure parity PWL0b) is generated at least partially based on third data and fourth data, such as data of the subset 1032 (e.g., third data to be stored in WL0 of block 0 of die M−1 922, fourth data to be stored in WL0 of block 0 of die M 923). The temporary erasure recovery data is generated based on the first data, the second data, the third data, and the fourth data (and the other data in the data group 960) and corresponds to the erasure parity QWL0 of FIG. 10. The first data, second data, third data, and fourth data are written to the non-volatile memory 802. The first erasure recovery data PWL0a is written to a first parity die (e.g., parity die P1 1020) of the non-volatile memory 803, the second erasure recovery data PWL0b is written to a second parity die (e.g., parity die P2 1021) of the non-volatile memory 803, and the temporary erasure recovery data QWL0 is stored in a volatile memory (e.g., the SRAM 950). Third erasure recovery data (e.g., PWL0) may be generated based on the first data, the second data, the third data, and the fourth data, and the third erasure recovery data may be stored in the parity die 924 in the non-volatile memory 803.

After writing the data of the data group 960 of FIG. 9 or 10 to the non-volatile memory 803, a write verification operation may be performed, such as an EPWR. For example, after performing each data write operation, the controller 830 may read the data from the non-volatile memory 803 and determine an error metric, such as an actual or estimated count of errors or error rate of the data (e.g., by determining a syndrome weight of the data). Alternatively, the non-volatile memory 803 may include data verification circuitry configured to read the data and generate the error metric. After determining that the error metric satisfies (e.g., does not exceed) an error threshold, the controller 830 may discard the temporary erasure parity QWL0 from the SRAM 950. In some implementations, the controller 830 maintains the temporary erasure parity QWL0 in the SRAM until all data that is written to adjacent word lines has been verified (e.g., because certain conditions, such as a short between WL0 and WL1, may cause attempted programming of data to WL1 to disturb the data stored in WL0), and after the controller 830 verifies that the data in in the data group 960 and the data group 961 are successfully written to the non-volatile memory, the controller 830 may discard QWL0.

In another illustrative example of the method 1300 with reference to FIG. 11, the first data corresponds to a logical page of data to be written to a first page location (e.g., WL0) in a first block location (e.g., block 0) in a first plane (e.g., plane 1 1121) of the non-volatile memory 803. The first erasure recovery data (e.g., B0 even WL parity 1161) is generated further based on second data to be written to the first page location (e.g., WL0) in the first block location (e.g., block 0) in a second plane (e.g., plane 0 1120) of the non-volatile memory 803. The temporary erasure recovery data (e.g., plane 1 even parity 1168, plane 1 odd parity 1169, or a combination thereof) is generated independent of the second data. The temporary erasure recovery data (e.g., plane 1 even parity 1168, plane 1 odd parity 1169, or a combination thereof) is generated based on data written to the first page location of multiple open blocks of the non-volatile memory, such as a result of XOR operation of data from each of the open blocks (e.g., block 0, block A, and block B). Modifying the temporary erasure recovery data (e.g., plane 1 even parity 1168, plane 1 odd parity 1169, or a combination thereof) includes performing an exclusive-or (XOR) operation of the first data and the temporary erasure recovery data in response to closing a first block (e.g., block 0 that includes the first data) after verifying that a block write operation is successful. To illustrate, after verifying that a block write operation to block 0 of FIG. 11 is successful, data in each word line having an even word line index (e.g., WL0, WL2, WL4, etc.) of block 0 of plane 1 1121 may be XORed with the plane 1 even parity 1168 to remove block 0's contribution to the plane 1 even parity 1168. In addition, data in each word line having an odd word line index (e.g., WL1, WL3, WL5, etc.) of block 0 of plane 1 1121 may be XORed with the plane 1 odd parity 1169 to remove block 0's contribution to the plane 1 odd parity 1169.

By generating and storing the temporary erasure data until a successful data write operation is verified, the additional erasure correction capacity provided by the temporary erasure data is available for erasure correction in case the write operation is determined to be unsuccessful. After verifying that the write operation is successful, the temporary erasure data may be discarded to conserve storage resources, such as storage capacity of the SRAM 950 of FIGS. 9-10, or may be modified such as described with reference to FIG. 11 to reduce the complexity of erasure recovery (by reducing the number of blocks that participate in the temporary erasure data) in case a subsequent write operation at another block is determined to be unsuccessful.

In conjunction with the figures and description herein, an apparatus is disclosed that includes means for storing data (e.g., the non-volatile memory 803). The apparatus also includes means for controlling the means for storing data (e.g., the controller 830). The means for controlling includes means for generating first erasure recovery data and temporary erasure recovery data at least partially based on first data to be written to the means for storing data (e.g., the erasure correction code engine 832). The first erasure recovery data is configured to enable a first type of data recovery with respect to the first data, and the temporary erasure recovery data is configured to enable a second type of data recovery with respect to the first data. The means for controlling is further configured, after verifying that the first data is stored in the means for storing data, to discard or modify the temporary erasure recovery data.

Although various components depicted herein are illustrated as block components and described in general terms, such components may include one or more microprocessors, state machines, or other circuits configured to enable such components to perform one or more operations described herein. For example, the erasure correcting code engine 832 may represent physical components, such as hardware controllers, state machines, logic circuits, or other structures, to enable the controller 130 to encode and decode partial parity symbols of an erasure correcting code.

Alternatively or in addition, the erasure correcting code engine 832 may be implemented using a microprocessor or microcontroller programmed to perform a hash operation. In a particular embodiment, the erasure correcting code engine 832 includes a processor executing instructions (e.g., firmware) that are stored at a drive of the non-volatile memory 803. Alternatively, or in addition, executable instructions that are executed by the processor may be stored at a separate memory location that is not part of the non-volatile memory 803, such as at a read-only memory (ROM) of the controller 130.

It should be appreciated that one or more operations described herein as being performed by the controller 830 may be performed at the non-volatile memory 803. As an illustrative example, in-memory ECC operations (e.g., encoding operations and/or decoding operations) may be performed at the non-volatile memory 803 alternatively or in addition to performing such operations at the controller 830.

The data storage device 802 may be coupled to, attached to, or embedded within one or more accessing devices, such as within a housing of the device 180. For example, the data storage device 802 may be embedded within the device 180 in accordance with a Joint Electron Devices Engineering Council (JEDEC) Solid State Technology Association Universal Flash Storage (UFS) configuration. To further illustrate, the data storage device 802 may be integrated within an electronic device (e.g., the device 180), such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory.

In one or more other implementations, the data storage device 802 may be implemented in a portable device configured to be selectively coupled to one or more external devices, such as a host device. For example, the data storage device 802 may be removable from the device 180 (i.e., "removably" coupled to the device 180). As an example, the data storage device 802 may be removably coupled to the device 180 in accordance with a removable universal serial bus (USB) configuration.

The device 180 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The device 180 may communicate via a controller, which may enable the device 180 to communicate with the data storage device 802. The device 180 may operate in compliance with a JEDEC Solid State Technology Association industry specification, such as an embedded MultiMedia Card (eMMC) specification or a Universal Flash Storage (UFS) Host Controller Interface specification. The device 180 may operate in compliance with one or more other specifications, such as a Secure Digital (SD) Host Controller specification as an illustrative example. Alternatively, the device 180 may communicate with the data storage device 802 in accordance with another communication protocol. In some implementations, the data storage device 802 may be integrated within a network-accessible data storage system, such as an enterprise data system, an NAS system, or a cloud data storage system, as illustrative examples.

In some implementations, the data storage device 802 may include a solid state drive (SSD). The data storage device 802 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the data storage device 802 may be coupled to the device 180 via a network. For example, the network may include a data center storage system network, an enterprise storage system network, a storage area network, a cloud storage network, a local area network (LAN), a wide area network (WAN), the Internet, and/or another network.

To further illustrate, the data storage device 802 may be configured to be coupled to the device 180 as embedded memory, such as in connection with an embedded Multi-Media Card (eMMC®) (trademark of JEDEC Solid State Technology Association, Arlington, Va.) configuration, as an illustrative example. The device 102 may correspond to an eMMC device. As another example, the data storage device 802 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a Compact-Flash® (CF) card (trademark of SanDisk Corporation, Milpitas, Calif.). The device 102 may operate in compliance with a JEDEC industry specification. For example, the data storage device 802 may operate in compliance with a JEDEC eMMC specification, a JEDEC Universal Flash Storage (UFS) specification, one or more other specifications, or a combination thereof.

A memory (e.g., a drive of the non-volatile memory 803) may include a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), another type of memory, or a combination thereof. In a particular embodiment, the data storage device 802 is indirectly coupled to an accessing device (e.g., the device 180) via a network. For example, the data storage device 802 may be a network-attached storage (NAS) device or a component (e.g., a solid-state drive (SSD) component) of a data center storage system, an enterprise storage system, or a storage area network.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
a non-volatile memory; and
a controller coupled to the non-volatile memory, the controller including:
   a volatile memory; and
   an erasure correcting code engine configured to
      generate first erasure recovery data and temporary erasure recovery data at least partially based on first data to be written to the non-volatile memory,
      perform a first type of data recovery of the first data based on the first erasure recovery data, and
      perform a second type of data recovery of the first data based on the temporary erasure recovery data,
wherein the controller is further configured to:
   store the first erasure recovery data and the temporary erasure recovery data in the volatile memory, and
   after verifying that the first data is stored in the non-volatile memory, discard or modify the temporary erasure recovery data.

2. The data storage device of claim 1, wherein the controller is further configured to discard the temporary erasure data to disable the second type of data recovery with respect to the first data.

3. The data storage device of claim 1, wherein the non-volatile memory comprises multiple flash memory dies.

4. The data storage device of claim 1, wherein:
the non-volatile memory includes:
   a first word line; and
   a second word line that is adjacent to the first word line;
the first data is included in a first data group that is stored in first storage elements coupled to the first word line; and
the controller is further configured to verify that second data of a second data group is stored in second storage elements coupled to the second word line prior to discarding the temporary erasure recovery data.

5. The data storage device of claim 1, wherein the first erasure recovery data corresponds to first parity data of a multi-die horizontal parity scheme, and wherein the temporary erasure recovery data corresponds to second parity data of the multi-die horizontal parity scheme.

6. The data storage device of claim 5, wherein the first erasure recovery data corresponds to an exclusive-or (XOR) parity, and wherein the temporary erasure recovery data corresponds to a Reed-Solomon parity.

7. The data storage device of claim 1, wherein the controller is further configured to modify the temporary erasure data to disable the second type of data recovery with respect to the first data.

8. The data storage device of claim 1, wherein the first erasure recovery data corresponds to first parity data of a horizontal parity scheme across multiple planes of the non-volatile memory, and wherein the temporary erasure recovery data corresponds to second parity data of a vertical parity scheme that excludes at least one plane of the multiple planes.

9. The data storage device of claim 8, wherein the first erasure recovery data corresponds to a first exclusive-or (XOR) parity, and wherein the temporary erasure recovery data corresponds to a second XOR parity.

10. A method comprising:
generating, with a controller of a data storage device, first erasure recovery data at least partially based on first data to be written to a non-volatile memory of the data storage device;
generating, with the controller, temporary erasure recovery data at least partially based on the first data;
controlling, with the controller, a volatile memory to store the temporary erasure recovery data;
writing, with the controller, the first data and the first erasure recovery data to the non-volatile memory; and
after verifying that the first data is stored in the non-volatile memory, discarding or modifying, with the controller, the temporary erasure recovery data.

11. The method of claim 10, wherein:
the first data corresponds to a logical page of data to be written to a first page location in a first block location of a first die of the non-volatile memory;
the first erasure recovery data is generated further based on second data to be written to the first page location in the first block location of a second die of the non-volatile memory; and the temporary erasure recovery data is generated further based on the second data.

12. The method of claim 11, further comprising:
generating second erasure recovery data at least partially based on third data and fourth data;
writing the third data, the fourth data, and the second erasure recovery data to the non-volatile memory; and
wherein the temporary erasure recovery data is generated further based on the third data and the fourth data.

13. The method of claim 12, wherein discarding or modifying the temporary erasure recovery data is performed after verifying that the first data, the second data, the third data, and the fourth data are stored in the non-volatile memory.

14. The method of claim 13, further comprising:
generating third erasure recovery data based on the first data, the second data, the third data, and the fourth data; and
storing the third erasure recovery data in the non-volatile memory.

15. The method of claim 10, wherein:
the first data corresponds to a logical page of data to be written to a first page location in a first block location in a first plane of the non-volatile memory;
the first erasure recovery data is generated farther based on second data to be written to the first page location in the first block location in a second plane of the non-volatile memory; and
the temporary erasure recovery data is generated independent of the second data.

16. The method of claim 15, wherein the temporary erasure recovery data is generated based on data written to the first page location of multiple open blocks of the non-volatile memory.

17. The method of claim 16, wherein modifying the temporary erasure recovery data includes performing an exclusive-or (XOR) operation of the first data and the temporary erasure recovery data in response to closing a first block after verifying that a block write operation is successful, wherein the block write operation includes writing the first data to the first block.

18. An apparatus comprising:
means for storing data; and
means for controlling the means for storing data, the means for controlling including
means for generating first erasure recovery data and temporary erasure recovery data at least partially based on first data to be written to the means for storing data,
means for performing a first type of data recovery of the first data based on the first erasure recovery data,
means for performing a second type of data recovery of the first data based on the temporary erasure recovery data, and
means for discarding or modifying the temporary erasure recovery data after verifying that the first data is stored in the means for storing data.

19. The apparatus of claim 18, wherein the first erasure recovery data corresponds to first parity data of a multi-die horizontal parity scheme, and wherein the temporary erasure recovery data corresponds to second parity data of the multi-die horizontal parity scheme.

20. The apparatus of claim 18, wherein the first erasure recovery data corresponds to first parity data of a horizontal parity scheme across multiple planes of the means for storing data, and wherein the temporary erasure recovery data corresponds to second parity data of a vertical parity scheme that excludes at least one plane of the multiple planes.

* * * * *